(12) United States Patent
Seo et al.

(10) Patent No.: US 12,550,498 B2
(45) Date of Patent: Feb. 10, 2026

(54) LIGHT EMITTING DEVICE AND DISPLAY DEVICE INCLUDING THE SAME

(71) Applicant: SAMSUNG ELECTRONICS CO., LTD., Suwon-si (KR)

(72) Inventors: Hong Kyu Seo, Suwon-si (KR); Soonmin Cha, Suwon-si (KR); Dongchan Kim, Suwon-si (KR); Enjung Kim, Suwon-si (KR); Taehyung Kim, Suwon-si (KR); Tae Ho Kim, Suwon-si (KR); Shin Ae Jun, Suwon-si (KR); You Jung Chung, Suwon-si (KR)

(73) Assignees: SAMSUNG DISPLAY CO., LTD., Gyeonggi-Do (KR); SAMSUNG ELECTRONICS CO., LTD, Gyeonggi-Do (KR)

( * ) Notice: Subject to any disclaimer, the term of this patent is extended or adjusted under 35 U.S.C. 154(b) by 395 days.

(21) Appl. No.: 18/349,485

(22) Filed: Jul. 10, 2023

(65) Prior Publication Data
US 2024/0014358 A1 Jan. 11, 2024

(30) Foreign Application Priority Data
Jul. 11, 2022 (KR) .................. 10-2022-0085158

(51) Int. Cl.
*H10H 20/854* (2025.01)
*H10H 20/01* (2025.01)
(Continued)

(52) U.S. Cl.
CPC .......... *H10H 20/854* (2025.01); *H10H 20/01* (2025.01); *H10H 20/812* (2025.01);
(Continued)

(58) Field of Classification Search
None
See application file for complete search history.

(56) References Cited

U.S. PATENT DOCUMENTS 9,780,256 B2 10/2017 Yang et al.
10,090,479 B2 10/2018 Kim et al.
(Continued)

FOREIGN PATENT DOCUMENTS

| CN | 109652061 A | 4/2019 |
|---|---|---|
| CN | 109609114 B | 3/2022 |

(Continued)

OTHER PUBLICATIONS

Extended European Search Report dated Oct. 24, 2023, of the corresponding European Patent Application No. 23184530.6, 5 pp.
(Continued)

*Primary Examiner* — Bradley Smith
(74) *Attorney, Agent, or Firm* — CANTOR COLBURN LLP

(57) ABSTRACT

An electroluminescent device that includes a first electrode and a second electrode spaced apart from each other, a light emitting layer disposed between the first electrode and the second electrode, an electron transport layer disposed between the light emitting layer and the second electrode, and an organic layer disposed on the electron transport layer. The light emitting layer includes a plurality of semiconductor nanoparticles, the electron transport layer includes a plurality of metal oxide nanoparticles, and the organic layer includes a polymeric acid compound.

20 Claims, 8 Drawing Sheets

(51) Int. Cl.
 *H10H 20/812* (2025.01)
 *H10H 20/816* (2025.01)
(52) U.S. Cl.
 CPC ......... *H10H 20/816* (2025.01); *H10H 20/032* (2025.01); *H10H 20/0362* (2025.01)

(56) References Cited

U.S. PATENT DOCUMENTS

| | | | |
|---|---|---|---|
| 10,266,760 | B2 | 4/2019 | Zhao et al. |
| 10,407,613 | B2 | 9/2019 | Zhao et al. |
| 10,533,127 | B2 | 1/2020 | Park et al. |
| 10,854,836 | B2 | 12/2020 | Kim et al. |
| 11,450,826 | B2 | 9/2022 | Kim et al. |
| 11,485,904 | B2 | 11/2022 | Chung et al. |
| 2018/0371313 | A1 | 12/2018 | Aksit et al. |
| 2019/0280231 | A1* | 9/2019 | Kim ............... H10K 50/115 |
| 2021/0032819 | A1 | 2/2021 | Wang et al. |
| 2021/0382352 | A1 | 12/2021 | Kim et al. |
| 2022/0006036 | A1 | 1/2022 | Seo et al. |
| 2023/0043694 | A1 | 2/2023 | Kim et al. |
| 2023/0235220 | A1* | 7/2023 | Min ..................... C09K 11/88 257/40 |

FOREIGN PATENT DOCUMENTS

| | | |
|---|---|---|
| JP | 6656865 B2 | 2/2020 |
| JP | 2021088116 A | 6/2021 |
| KR | 20170022952 A | 3/2017 |
| KR | 101729084 B1 | 5/2017 |
| KR | 20180076386 A | 7/2018 |
| KR | 20180097146 A | 8/2018 |
| KR | 20180099784 A | 9/2018 |
| KR | 20190019863 A | 2/2019 |
| KR | 20200015433 A | 2/2020 |
| KR | 20210153170 A | 12/2021 |
| KR | 20220003356 A | 1/2022 |
| KR | 102377234 B1 | 3/2022 |

OTHER PUBLICATIONS

Reed T. Heintzkill, Fabrication of Silver-Doped Zinc Oxide Thin Films Through Optimized Sol-Gel Deposition and Nanoparticle Wetting Process, A Thesis Submitted in Partial Fulfillment of the Requirements for the Degree of Master of Science in Engineering, Dec. 2018, 212 pp.

* cited by examiner

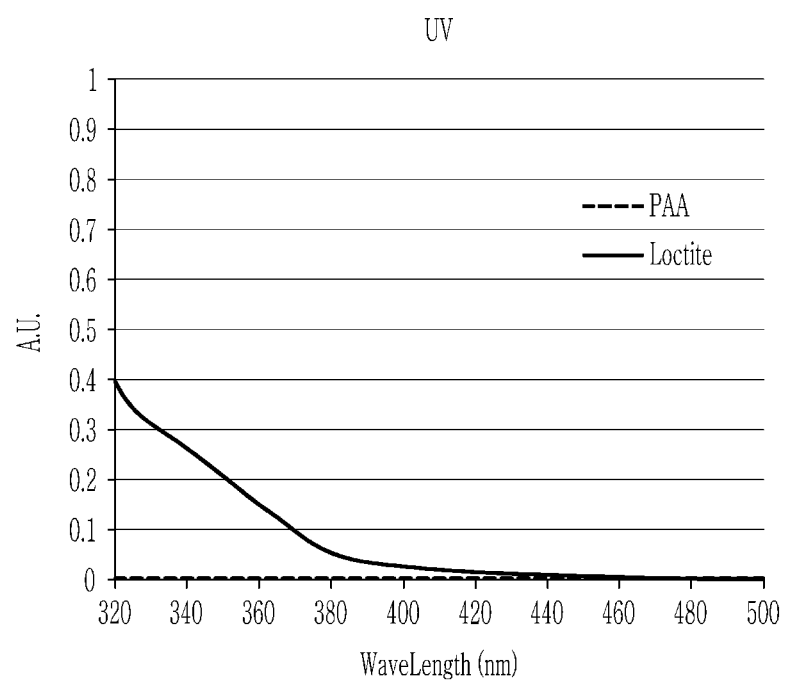

LIGHT EMITTING DEVICE AND DISPLAY DEVICE INCLUDING THE SAME

CROSS-REFERENCE TO RELATED APPLICATION

This application claims priority to Korean Patent Application No. 10-2022-0085158 filed in the Korean Intellectual Property Office on Jul. 11, 2022, and all the benefits accruing therefrom under 35 U.S.C. § 119, the content of which in its entirety is herein incorporated by reference.

BACKGROUND

1. Field

The present disclosure relates to a light emitting (e.g., electroluminescent) device and a display device including the electroluminescent) device.

2. Description of the Related Art

A semiconductor nanoparticle (e.g., a semiconductor nanocrystal particle) having a nanometer size may exhibit luminescence properties. For example, a quantum dot including a semiconductor nanocrystal may exhibit a quantum confinement effect. The light emission from the semiconductor nanoparticle may occur when an electron in an excited state resulting from light excitation or an applied voltage transitions from a conduction band to a valence band. The semiconductor particle may be configured to emit light of a desired wavelength region by adjusting a size of the semiconductor nanoparticle, a composition of the semiconductor nanoparticle, or a combination thereof.

A semiconductor nanoparticle may be used, for example, in a light emitting device (e.g., an electroluminescent device) or a display device including the electroluminescent device.

SUMMARY

An embodiment provides a luminescent device that emits light, for example, by applying a voltage to a nanostructure (e.g., a semiconductor nanoparticle such as a quantum dot), for example with or without a separate irradiation light source.

An embodiment provides a display device (e.g., a quantum dot-light emitting diode (QD-LED) display device) that includes a plurality of semiconductor nanoparticles such as a quantum dots as a component of a light emitting layer in a pixel configuration (e.g., in a configuration of a blue pixel, a red pixel, a green pixel, or a combination thereof).

In an embodiment, an electroluminescent device includes:
a first electrode and a second electrode spaced apart from each other (e.g., each electrode having a surface opposite the other), a light emitting layer disposed between the first electrode and the second electrode, an electron transport layer disposed between the light emitting layer and the second electrode, and an organic layer disposed on the electron transport layer;
wherein the light emitting layer includes a plurality of semiconductor nanoparticles, the electron transport layer includes a plurality of metal oxide nanoparticles, and the organic layer includes a polymeric acid compound,
wherein the polymeric acid compound comprises a carboxylic acid group (e.g., —COOH), a phosphonic acid group (—PO(OH)$_2$), a sulfonic acid group (—SO$_3$H), or a combination thereof and has an average molecular weight of greater than or equal to about 800 g/mol and less than or equal to about 8,000,000 g/mol.

The electron transport layer may have a first surface facing the light emitting layer and a second surface opposite to the first surface, and the organic layer may be disposed on the second surface.

The electroluminescent device may be configured to emit green light with application of a voltage. The electroluminescent device may be configured to emit blue light with application of a voltage. The electroluminescent device may be configured to emit red light with application of a voltage.

The plurality of the semiconductor nanoparticles may not include cadmium, lead, mercury, or a combination thereof.

The electroluminescent device may further include a hole auxiliary layer between the light emitting layer and the first electrode. The hole auxiliary layer may include a hole transport layer (e.g., including an organic compound), a hole injection layer, or a combination thereof.

The plurality of semiconductor nanoparticles may include a first semiconductor nanocrystal including zinc, selenium, and tellurium, and a second semiconductor nanocrystal including a zinc chalcogenide, the second semiconductor nanocrystal being different from the first semiconductor nanocrystal. The plurality of semiconductor nanoparticles may include a first semiconductor nanocrystal including (a Group III-V compound or an indium phosphide compound including) indium, phosphorus, and optionally zinc; and a second semiconductor nanocrystal including a zinc chalcogenide and different from the first semiconductor nanocrystal.

An average size of the plurality of the semiconductor nanoparticles may be greater than or equal to about 4 nanometers (nm), greater than or equal to about 5 nm, greater than or equal to about 7 nm, greater than or equal to about 8 nm, greater than or equal to about 9 nm, or greater than or equal to about 10 nm. An average size of the plurality of semiconductor nanoparticles may be less than or equal to about 30 nm, less than or equal to about 20 nm, less than or equal to about 15 nm, less than or equal to about 12 nm, or less than or equal to about 10 nm.

The semiconductor nanoparticle may have a core-shell structure that includes a core including the first semiconductor nanocrystal and a shell disposed on the core and including the second semiconductor nanocrystal.

The electron transport layer may be adjacent to (or disposed directly on) the light emitting layer. The organic layer may be adjacent to (or disposed directly on) the electron transport layer.

The average molecular weight of the polymeric acid compound may be greater than or equal to about 1200 g/mol, e.g., greater than or equal to about 1700 g/mol. The average molecular weight of the polymeric acid compound may be less than or equal to about 1,200,000 g/mol, e.g., less than or equal to about 500,000 g/mol.

The polymeric acid compound may exhibit a solubility of greater than or equal to about 1 gram per liter (g/L), or greater than or equal to about 200 g/L, with respect to water for example, at room temperature for example, at a temperature of about 20° C. to about 23° C. The polymeric acid compound may exhibit a solubility of greater than or equal to about 1 g/L, or greater than or equal to about 200 g/L with respect to a C1 to C5 alcohol, at room temperature for example, at a temperature of about 20° C. to about 23° C. The polymeric acid compound may exhibit a solubility of less than or equal to about 1000 g/L or less than or equal to about 600 g/L, with respect to water or with respect to a C1 to C5 alcohol.

The polymeric acid compound may exhibit a pH of greater than or equal to about 0.5, or greater than or equal to about 1 and less than or equal to about 5, or less than or equal to about 4.5, in a solution state (e.g., in an aqueous solution).

The polymeric acid compound may include a polyacrylic acid compound, a polymethacrylic acid, a polyacrylic acid-methacrylic acid, an alkali metal salt (e.g., a sodium salt) of polyacrylic acid (or a partial alkali metal salt of polyacrylic acid), a copolymer including a (meth)acrylic acid repeating unit, a polyvinyl phosphonic acid, a poly(aromatic sulfonic acid) such as a poly(styrene sulfonic acid), a poly(styrene sulfonic acid-co-maleic acid), an alkali metal salt (e.g., a partial salt) of a poly(aromatic sulfonic acid), a poly(vinyl sulfonic acid), a polymaleic acid, or a combination thereof (for example, a copolymer of at least two of the foregoing polymers or a mixture of at least two of the foregoing polymers).

The organic layer may further include or may not include an additive. The additive may include an inorganic acid such as a sulfuric acid, a C2-50 carboxylic acid compound (e.g., represented by $R(COOH)_n$), a sulfinic acid compound (e.g., represented by $R(SO_2H)_n$), a sulfonic acid compound (e.g., represented by $R(SO_3H)_n$), or a combination thereof. In the formulae, the R is a substituted or unsubstituted C1 (or C6) to C50 aliphatic or aromatic hydrocarbon group, and the n is an integer of 1 to 10, 2 to 8, or 3 to 6.

The organic layer or the additive may include a polycarboxylic acid compound. The polycarboxylic acid may be non-polymeric compound. The polycarboxylic acid may be a compound having 2 to 10 carboxylic acid groups. The polycarboxylic acid compound may have 1 to 10, 2 to 5, 3 to 4 $C_{1-50}$ or $C_{6-15}$ aliphatic hydrocarbon group(s), 1 to 10, 2 to 5, 3 to 4 $C_{6-15}$ aromatic hydrocarbon group(s), or a combination thereof.

The polycarboxylic acid compound may further include a hydroxyl group.

The additive may include benzoic acid, succinic acid, maleic acid, fumaric acid, malic acid, glutaric acid, adipic acid, pimelic acid, citric acid, oxalic acid, malonic acid, phthalic acid, isophthalic acid, terephthalic acid, trimellitic acid, hemimellitic acid, azelaic acid, suberic acid, tartaric acid, itaconic acid, dodecanedioic acid, sulfuric acid, acetic acid, a (meth)acrylic acid, or a combination thereof.

An amount of a cross-linked polymer in the organic layer may be less than about 1 weight percent (wt %), or less than or equal to about 0.9 wt %, based on a total weight of the organic layer.

The organic layer may not include a cross-linked polymer.

At least a portion of the organic layer may be configured to dissolve upon being immersed in water or a C1 to C5 alcohol.

The temperature of the water (or the temperature of the C1 to C5 alcohol) may be greater than or equal to about 25° C.

The temperature of the water (or the temperature of the C1 to C5 alcohol) may be less than or equal to a boiling point thereof (for example, about 50° C. or less, or about 30° C. or less).

A thickness of the organic layer may be greater than or equal to about 10 nm, or greater than or equal to about 100 nm.

A thickness of the organic layer may be less than or equal to about 100 micrometers (μm), or less than or equal to about 10 μm.

The second electrode may have a first surface facing a surface of the electron transport layer and a second surface opposite the first surface. The organic layer may be disposed on at least a portion (or the entire) of the surface of the electron transport layer and/or at least a portion (or the entire) of the second surface of the second electrode.

The metal oxide nanoparticle may include a zinc oxide. The metal oxide nanoparticle may include zinc; and optionally a Group IIA metal, Zr, W, Li, Ti, Y, Al, Ga, In, Sn, Co V, or a combination thereof. The metal oxide may include zinc, a Group IIA metal, and optionally an alkali metal.

The metal oxide nanoparticle may include a compound represented by $Zn_{1-x}M_xO$, wherein, M is Mg, Ca, Zr, Co, W, Li, Ti, Y, Al, or a combination thereof, and $0 \le x \le 0.5$. The x may be greater than or equal to about 0.01, greater than or equal to about 0.03, greater than or equal to about 0.05, greater than or equal to about 0.1, or greater than or equal to about 0.15. The x may be less than or equal to about 0.45, or less than or equal to about 0.4. A size of an average size (hereinafter, referred to as "size") of the metal oxide nanoparticle(s) may be greater than or equal to about 1 nm, or greater than or equal to about 3 nm. The size of the metal oxide nanoparticle(s) may be less than or equal to about 10 nm, or less than or equal to about 8 nm.

The electroluminescent device may be configured to emit blue light and may have a T90 of greater than or equal to about 20 hours as operated at an initial luminance of about 650 nits.

The electroluminescent device may exhibit a maximum luminance of greater than or equal to about 60,000 nits (candelas per square meter, $cd/m^2$), greater than or equal to about 70,000 nits, or greater than or equal to about 80,000 nits.

The electroluminescent device may exhibit a maximum external quantum efficiency of greater than or equal to about 6%, greater than or equal to about 8%, or greater than or equal to about 10%.

The electroluminescent device may have a maximum luminous efficiency of greater than or equal to about 6 candela per ampere (cd/A).

The electroluminescent device may exhibit a delta voltage (e.g., a voltage increase) of less than or equal to about 1.5 volts, less than or equal to about 1.2 volts, less than or equal to about 1 volt, or less than or equal to about 0.8 volts, as operated at a luminance of 650 nits for a predetermined time (for example, greater than or equal to about 100 hours, 150 hours, or 200 hours).

In an embodiment, a display device or an electronic device may include the electroluminescent device.

The display device or an electronic device may include (or may be) AR/VR device, a handheld terminal, a monitor, a notebook computer, a television, an electronic display board, a camera, an electronic display component for an automatic vehicle or an electric car.

In an embodiment, a method of producing the electroluminescent device includes:
  forming the light emitting layer on the first electrode;
  forming the electron transport layer on the light emitting layer;
  forming the second electrode on the electron transport layer;
  forming the organic layer on the electron transport layer; and
  maintaining a layered structure including the organic layer at a temperature of greater than or equal to about 40° C., greater than or equal to about 45° C., or greater than or equal to about 55° C. and less than or equal to about 120° C. (e.g., for a predetermined time period of greater than or equal to about 24 hours and less than or equal to about 10 days) to produce the device, wherein the formation of the organic layer includes:

applying on the electron transport layer or the second electrode layer an organic layer forming composition including the polymeric acid compound in water and/or an organic solvent.

The organic layer forming composition may be obtained by dissolving the polymeric acid compound in the water or the organic solvent.

The organic solvent may include a C1-C10 alcohol, a nitrile solvent, an ester solvent, or a combination thereof.

The organic solvent may include ethanol, methanol, propanol, acetonitrile, ethyl acetate, or a combination thereof. The organic layer forming composition may further include a polycarboxylic acid compound. The polycarboxylic acid compound may include a C2-50 or C6-C15 polycarboxylic acid compound having two to ten carboxylic acid groups.

According to an embodiment, the electroluminescent device may exhibit an improvement in both of electroluminescent properties and lifespan.

According to one embodiment, the electroluminescent device may be configured to substantially block hole leakage through the electron auxiliary layer (e.g., electron transport layer), and/or may exhibit an increased electron transport, may achieve an improved electron-hole balance.

According to one embodiment, the electroluminescent device may be configured to effectively suppress or prevent material degradation due to charging.

In an electroluminescent device of an embodiment, the organic layer may be formed from a composition having a relatively low viscosity and may not exhibit light absorption in a predetermined wavelength range (e.g., from about 320 nm to about 440 nm), e.g., may exhibit a light transmission of at least 90% or 95% or 99% in the wavelength range, which enables the device to be used with little or no limitation as a light emitting device (e.g., to be used in a top emission manner or in a bottom emission manner).

In an electroluminescent device of an embodiment, an electron transport layer (ETL) may exhibit improved electron mobility, which may contribute to improving the hole-electron balance in the light emitting layer and may allow the electrons to be transported efficiently to the quantum dot light emitting layer.

In the electroluminescent device of an embodiment, the electron auxiliary layer (e.g., the electron transport layer) may have a HOMO energy level with a desired depth, which may suppress the generation of a trap level, thereby relatively effectively blocking an unwanted hole movement, for example, from the light emitting layer to the second electrode.

BRIEF DESCRIPTION OF THE DRAWINGS

The above and other advantages and features of this disclosure will become more apparent by describing in further detail exemplary embodiments thereof with reference to the accompanying drawings, in which:

FIG. 6 is a plot illustrating the results of the UV-Vis absorption spectroscopy analysis for the polymeric acid compound used in the Examples (PAA) and the polymer used in Comparative Example 3 (Loctite).

DETAILED DESCRIPTION

Figure 1A:
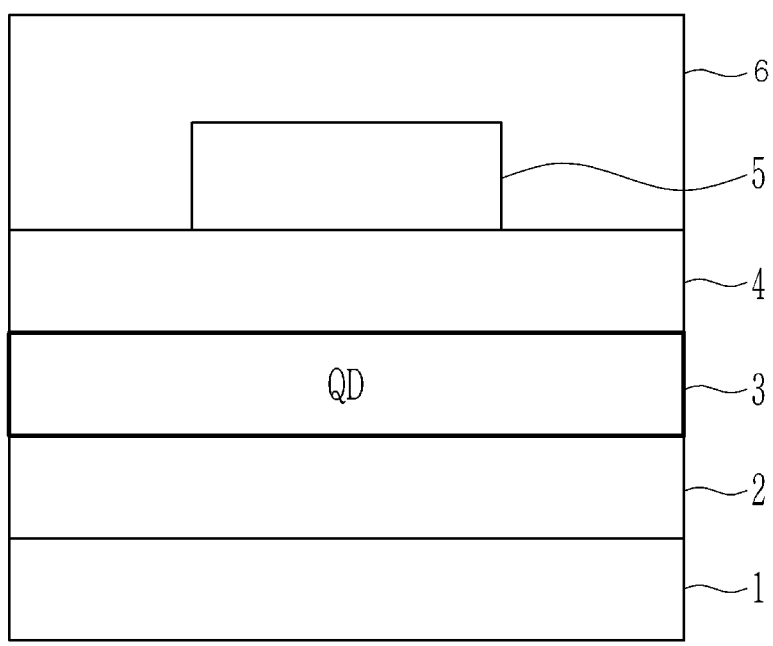
FIG. 1A is a schematic cross-sectional view of an electroluminescent device according to an embodiment.

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art.

In order to clearly explain the present disclosure, parts irrelevant to the description are omitted, and the same reference numerals are assigned to the same or similar elements throughout the specification. In the drawings, the thickness of layers, films, panels, regions, etc., are exaggerated for clarity. And in the drawings, for convenience of description, the thickness of some layers and regions are exaggerated. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In addition, it will be understood that when an element such as a layer, film, region, or substrate is referred to as being "on" another element, it can be directly on the other element or intervening elements may also be present. In contrast, when an element is referred to as being "directly on" another element, there are no intervening elements present. Also, to be disposed "on" the reference portion means to be disposed above or below the reference portion and does not necessarily mean "above".

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as being limited to "a" or "an." "Or" means "and/or."

As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As used herein, the term "cross-sectional phase" means a case in which a cross-section of a given object is cut, for example, in a substantially vertical direction and is viewed laterally.

Unless otherwise defined, all terms (including technical and scientific terms) used herein have the same meaning as commonly understood by one of ordinary skill in the art to which this disclosure belongs. It will be further understood that terms, such as those defined in commonly used, e.g., non-technical, dictionaries, should be interpreted as having a meaning that is consistent with their meaning in the context of the relevant art and the present disclosure, and will not be interpreted in an idealized or overly formal sense unless expressly so defined herein.

Hereinafter, values of a work function, a conduction band, or a lowest unoccupied molecular orbital (LUMO) (or valence band or highest occupied molecular orbital (HOMO)) energy level is expressed as an absolute value from a vacuum level. In addition, when the work function or the energy level is referred to be "deep," "high" or "large," the work function or the energy level has a large absolute value based on "0 electron volts (eV)" of the vacuum level, while when the work function or the energy level is referred to be "shallow," "low," or "small," the work function or energy level has a small absolute value based on "0 eV" of the vacuum level.

As used herein, the average (value) may be mean or median. In an embodiment, the average (value) may be a mean average.

As used herein, the term "peak emission wavelength" is the wavelength at which a given emission spectrum of the light reaches its maximum.

As used herein, the term "Group" may refer to a group of Periodic Table.

As used herein, "Group I" refers to Group IA and Group IB, and examples may include Li, Na, K, Rb, and Cs, but are not limited thereto.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group IIIA metal may be Al, In, Ga, and TI, and examples of Group IIIB may be scandium, yttrium, or the like, but are not limited thereto.

As used herein, "Group IV" refers to Group IVA and Group IVB, and examples of a Group IVA metal may be Si, Ge, and Sn, and examples of Group IVB metal may be titanium, zirconium, hafnium, or the like, but are not limited thereto.

As used herein, "Group V" includes Group VA and includes nitrogen, phosphorus, arsenic, antimony, and bismuth, but is not limited thereto.

As used herein, "Group VI" includes Group VIA and includes sulfur, selenium, and tellurium, but is not limited thereto.

As used herein, "metal" includes a semi-metal such as Si.

As used herein, a number of carbon atoms in a group or a molecule may be referred to as a subscript (e.g., $C_{6-50}$) or as C6 to C50.

As used herein, when a definition is not otherwise provided, "substituted" refers to replacement of at least one hydrogen of a compound or a group for a corresponding group moiety including a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are each independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, "hydrocarbon" or "hydrocarbon group" refers to a compound or a group including carbon and hydrogen (e.g., alkyl, alkenyl, alkynyl, or aryl group). The hydrocarbon group may be a monovalent group or a group having a valence of greater than one formed by removal of a, e.g., one or more, hydrogen atoms from alkane, alkene, alkyne, or arene. In the hydrocarbon or hydrocarbon group, a, e.g., at least one, methylene may be replaced by an oxide moiety, a carbonyl moiety, an ester moiety, —NH—, or a combination thereof. Unless otherwise stated to the contrary, the hydrocarbon compound or hydrocarbon group (alkyl, alkenyl, alkynyl, or aryl) may have 1 to 60, 2 to 32, 3 to 24, or 4 to 12 carbon atoms.

As used herein, when a definition is not otherwise provided, "alkyl" refers to a linear or branched saturated monovalent hydrocarbon group (methyl, ethyl hexyl, etc.). In an embodiment, an alkyl group may have from 1 to 50 carbon atoms, or 1 to 18 carbon atoms, or 1 to 12 carbon atoms.

As used herein, when a definition is not otherwise provided, "alkenyl" refers to a linear or branched monovalent hydrocarbon group having a carbon-carbon double bond. In an embodiment, an alkenyl group may have from 2 to 50 carbon atoms, or 2 to 18 carbon atoms, or 2 to 12 carbon atoms.

As used herein, when a definition is not otherwise provided, "alkynyl" refers to a linear or branched monovalent hydrocarbon group having a carbon-carbon triple bond. In an embodiment, an alkenyl group may have from 2 to 50 carbon atoms, or 2 to 18 carbon atoms, or 2 to 12 carbon atoms.

As used herein, when a definition is not otherwise provided, "aryl" refers to a group formed by removal of a, e.g., at least one, hydrogen from an arene (e.g., a phenyl or naphthyl group). In an embodiment, an aryl group may have 6 to 50 carbon atoms, or 6 to 18 carbon atoms, or 6 to 12 carbon atoms.

As used herein, when a definition is not otherwise provided, "hetero" refers to inclusion of 1 to 3 heteroatoms, e.g., N, O, S, Si, P, or a combination thereof.

As used herein, when a definition is not otherwise provided, "alkoxy" refers to an alkyl group linked to oxygen (e.g., alkyl-O—) for example, a methoxy group, an ethoxy group, or a sec-butyloxy group.

As used herein, when a definition is not otherwise provided, "amine" is a compound represented by $NR_3$, wherein each R is independently hydrogen, a C1-C12 alkyl group, a C7-C20 alkylarylene group, a C7-C20 arylalkylene group, or a C6-C18 aryl group.

As used herein, "poly(meth)acrylate" refers to a polyacrylate, a polymethacrylate, or a combination thereof.

In an embodiment, "an alkali metal salt" of a polymeric acid (e.g., polyacrylic acid or polystryrenesulfonic acid) compound may include a partial alkali metal salt of a given polymeric acid, a full alkali metal salt of the polymeric acid, or a combination thereof.

As used herein, the expression "not including cadmium (or other harmful heavy metal)" may refer to the case in which a concentration of cadmium (or another heavy metal deemed harmful) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other toxic heavy toxic metal) may be present or, if present, an amount of cadmium (or other heavy metal) may be less than or equal to a detection limit or as an impurity level of a given analysis tool (e.g., an inductively coupled plasma atomic emission spectroscopy instrument).

Unless mentioned to the contrary, a numerical range recited herein is inclusive. Unless mentioned to the contrary, a numerical range recited herein includes any real number within the endpoints of the stated range and includes the endpoints thereof. As used herein, the upper and lower endpoints set forth for various numerical values may be independently combined to provide a range.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±5% of the stated value.

As used herein, a nanoparticle is a structure having a, e.g., at least one, region or characteristic dimension with a nanoscale dimension. In an embodiment, a dimension (or an average dimension) of the nanostructure is less than or equal to about 500 nm, less than or equal to about 300 nm, less than or equal to about 250 nm, less than or equal to about 150 nm, less than or equal to about 100 nm, less than or equal to about 50 nm, or less than or equal to about 30 nm. In an embodiment, the nanoparticle may have any suitable shape. The nanoparticle (e.g., a semiconductor nanoparticle or a metal oxide nanoparticle) may include a nanowire, a nanorod, a nanotube, a branched nanostructure, a nanotetrapod, a nanotripod, a nanobipod, a nanocrystal, a nanodot, a multi-pod type shape such as at least two pods, or the like and is not limited thereto. The nanoparticle can be, e.g., substantially crystalline, substantially monocrystalline, polycrystalline, (for example, at least partially) amorphous, or a combination thereof.

In an embodiment, a semiconductor nanoparticle such as a quantum dot may exhibit quantum confinement or exciton confinement. As used herein, the term "quantum dot" or "semiconductor nanostructure" is not limited in a shape thereof unless otherwise defined. A semiconductor nanoparticle or a quantum dot may have a size smaller than a Bohr excitation diameter for a bulk crystal material having an identical composition and may exhibit a quantum confinement effect. The semiconductor nanoparticle or the quantum dot may emit light corresponding to a bandgap energy thereof by controlling a size of a nanocrystal acting as an emission center.

As used herein, the term "T50" is a time (hours, hr) the brightness (e.g., luminance) of a given device decreases to 50% of the initial brightness (100%) as, e.g., when, the given device is started to be driven, e.g., operated, at a predetermined initial brightness (e.g., 650 nit).

As used herein, the term "T90" is a time (hr) the brightness (e.g., luminance) of a given device decreases to 90% of the initial brightness (100%) as the given device is started to be driven at a predetermined initial brightness (e.g., 650 nit).

As used herein, the phrase "external quantum efficiency (EQE)" is a ratio of the number of photons emitted from a light emitting diode (LED) to the number of electrons passing through the device and can be a measurement as to how efficiently a given device converts electrons to photons and allows the photons to escape. The EQE can be determined by the following equation:

$$EQE = \text{an efficiency of injection} \times \text{a (solid-state) quantum yield} \times \text{an efficiency of extraction.}$$

wherein the efficiency of injection is a proportion of electrons passing through the device that are injected into the active region, the quantum yield is a proportion of all electron-hole recombination in the active region that are radiative and produce photons, the efficiency of extraction is a proportion of photons generated in the active region that escape from the given device.

As used herein, a maximum EQE is a greatest value of the EQE.

As used herein, a maximum luminance is the highest value of luminance for a given device.

As used herein, the phrase, quantum efficiency, may be used interchangeably with the phrase, quantum yield. In an embodiment, the quantum efficiency may be a relative quantum yield or an absolute quantum yield, for example, which can be readily measured by any suitable, e.g., commercially available, equipment. The quantum efficiency (or quantum yield) may be measured in a solution state or a solid state (in a composite). In an embodiment, "quantum yield (or quantum efficiency)" may be a ratio of photons emitted to photons absorbed, e.g., by a nanostructure or population of nanostructures. In an embodiment, the quantum efficiency may be determined by any suitable method. For example, there may be two methods for measuring the fluorescence quantum yield or efficiency: the absolute method and the relative method.

The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on the photoluminescence (PL) wavelengths thereof, but are not limited thereto.

A bandgap energy of a semiconductor nanoparticle may vary with a size and a composition of a nanocrystal. For example, as a size of the semiconductor nanoparticle increases, the bandgap energy of the semiconductor nanoparticle may become smaller, e.g., narrower, and the semiconductor nanoparticle may emit light of, e.g., having an, increased emission wavelength. A semiconductor nanocrystal may be used as a light emitting material in various fields of, e.g., such as in, a display device, an energy device, or a bio light emitting device.

A semiconductor nanoparticle based electroluminescent device (hereinafter, also referred to as a QD-LED) may emit light by applying a voltage and includes a semiconductor nanoparticle or a quantum dot as a light emitting material. A QD-LED, which uses a different emission principle than an organic light emitting diode (OLED), may exhibit light emission with more desirable optical properties, e.g., higher purity, colors (e.g., red, green, and blue) and improved color reproducibility, and therefore, may be the basis for a next generation display device. A method of producing a QD-LED may include a solution process, which may lower, e.g., reduce, a manufacturing cost. In addition, semiconductor nanoparticles in a QD-LED may be based on an inorganic material, contributing to realization of increased display (light emission) stability over time.

In the QD-LED of an embodiment, holes and electrons provided from the two electrodes (e.g., a cathode and an anode) and passing through several common layers may meet and combine in the emission layer (EML, Emitting layer, QD emission layer) to form excitons resulting in light emission. In an embodiment of the QD-LED, common layers may be provided between the light emitting layer and the electrode, e.g., to facilitate injection of holes and electrons as a voltage is applied, and thus the design of these common layers may have an effect on properties (e.g., optical or stability property) of the device.

In addition, a quantum dot or a semiconductor nanoparticle exhibiting a desirable electroluminescent property may contain a harmful heavy metal such as cadmium (Cd), lead, mercury, or a combination thereof. Accordingly, it may be desirable to provide an electroluminescent device or a display device having a light emitting layer substantially free of such heavy metals.

In an embodiment, an electroluminescent device may be a device configured to emit a desired light by applying a voltage, for example, with or without a separate light source.

Figure 1B:
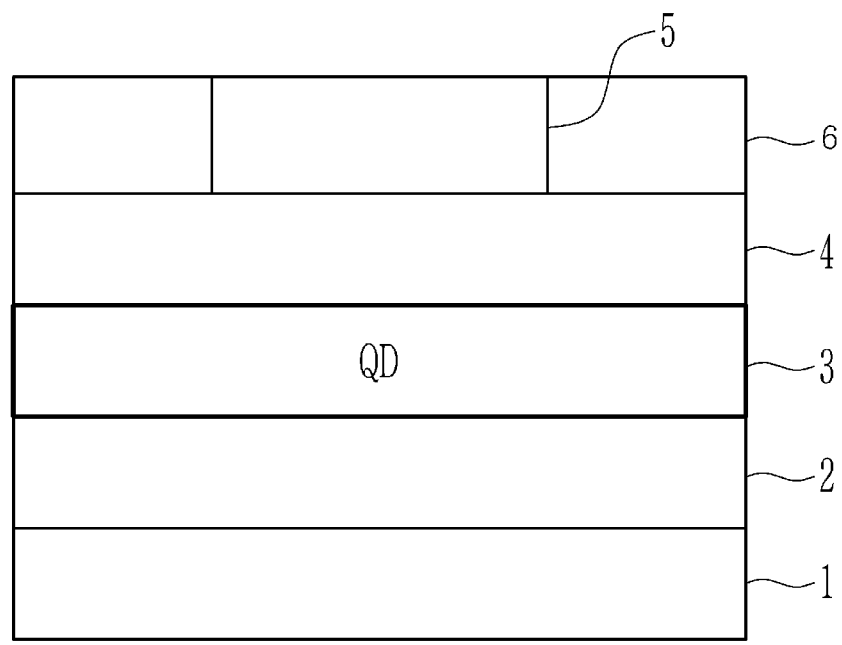
FIG. 1B is a schematic cross-sectional view of an electroluminescent device according to an embodiment.

In an embodiment, an electroluminescent device includes a first electrode 1 and a second electrode 5 spaced apart each other (e.g., each having a surface opposite the other, i.e., each with a surface facing each other); and a light emitting layer 3 disposed between the first electrode 1 and the second electrode 5, and an electron transport layer 4 (or an electron auxiliary layer including the same) disposed between the light emitting layer 3 and the second electrode 5. An organic layer 6 may be disposed on or over the electron transport layer 4. In an embodiment, the electroluminescent device may further include a hole auxiliary layer 2 between the light emitting layer and the first electrode. The hole auxiliary layer may include a hole transport layer, a hole injection layer, or a combination thereof. The hole auxiliary layer may include an organic compound. See FIG. 1A and FIG. 1B.

The first electrode may include an anode, and the second electrode may include a cathode. The first electrode may include a cathode and the second electrode may include an anode. In an embodiment, the second electrode includes a cathode. In the electroluminescent device of an embodiment, the first electrode 10 or the second electrode 50 may be disposed on a (transparent) substrate 100. (see FIG. 2A and FIG. 2B). The transparent substrate may be a light extraction surface. The light emitting layer may be disposed in a pixel (or a subpixel) of a display device described herein.

Figure 2A:
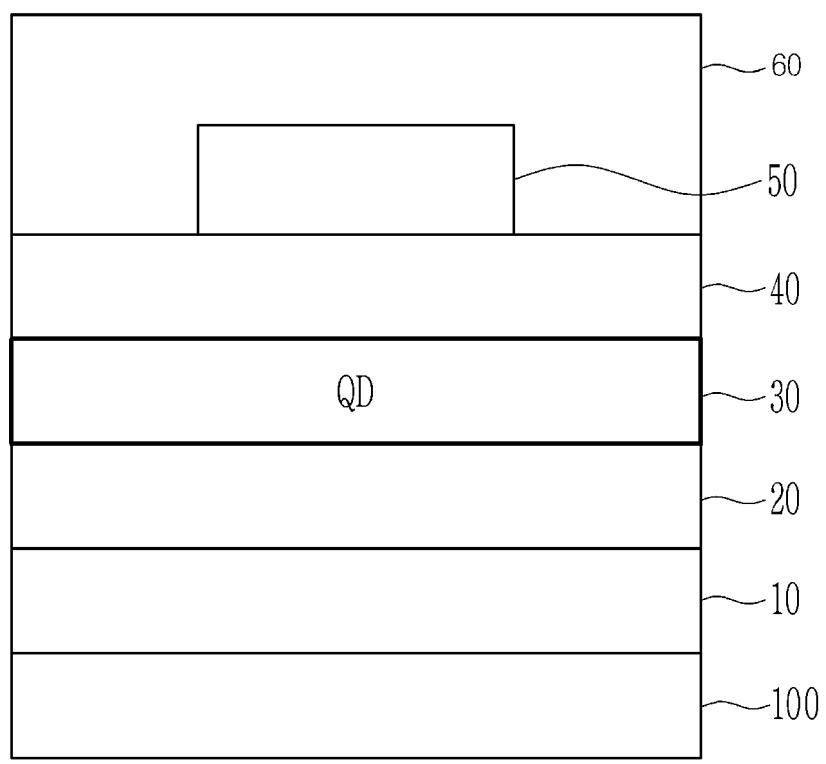
FIG. 2A is a schematic cross-sectional view of an electroluminescent device according to an embodiment.
Figure 2B:
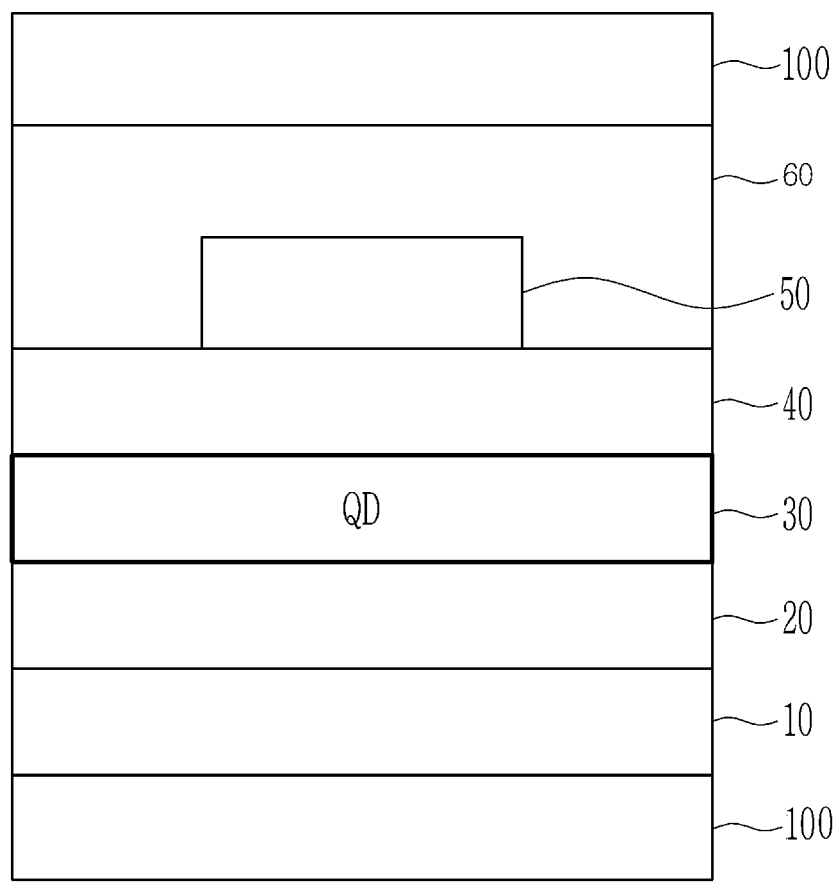
FIG. 2B is a schematic cross-sectional view of an electroluminescent device according to an embodiment.

Referring to FIGS. 2A and 2B, in an electroluminescent device of an embodiment, a light emitting layer 30 may be disposed between a first electrode (e.g., anode) 10 and a second electrode (e.g., cathode) 50. The cathode 50 may include an electron injection conductor. The anode 10 may include a hole injection conductor. The work functions of the electron/hole injection conductors included in the cathode and the anode may be appropriately adjusted and are not particularly limited. For example, the cathode may have a small work function and the anode may have a relatively large work function, or vice versa.

The electron/hole injection conductors may include a metal-based material (e.g., a metal, a metal compound, an alloy, or a combination thereof) such as aluminum, magnesium, tungsten, nickel, cobalt, platinum, palladium, calcium, LiF, etc.; a metal oxide such as gallium indium oxide or indium tin oxide (ITO); or a conductive polymer (e.g., having a relatively high work function) such as polyethylene dioxythiophene, but are not limited thereto.

The first electrode, the second electrode, or a combination thereof may be a light-transmitting electrode or a transparent electrode. In an embodiment, both the first electrode and the second electrode may be a light-transmitting electrode. The first electrode, the second electrode, or a combination thereof may be patterned electrodes.

The first electrode, the second electrode, or a combination thereof may be disposed on a (e.g., insulating) substrate 100. The substrate 100 may be a substrate including an insulating material. The substrate may include glass; various polymers such as a polyester of polyethylene terephthalate (PET), polyethylene naphthalate (PEN), and the like, polycarbonate, and polyacrylate; a polysiloxane (e.g., polydimethylsiloxane (PDMS)); an inorganic material such as $Al_2O_3$ or ZnO; or a combination thereof but is not limited thereto. A thickness of the substrate may be appropriately selected taking into consideration a substrate material but is not particularly limited. The substrate may be a flexible substrate. The substrate 100 may be optically transparent (e.g., may have a light transmittance of greater than or equal to about 50%, greater than or equal to about 60%, greater than or equal to about 70%, greater than or equal to about 80%, greater than or equal to about 85%, or greater than or equal to about 90% and, for example, less than or equal to about 99%, or less than or equal to about 95%). The substrate may have a transmittance of greater than or equal to about 50%, greater than or equal to about 60%, greater than or equal to about 70%, greater than or equal to about 80%, or greater than or equal to about 90% for light emitted from semiconductor nanoparticles that are described herein. The substrate 100 may include a region for a blue pixel, a region for a red pixel, a region for a green pixel, or a combination thereof.

In an embodiment, a thin film transistor may be disposed in each region of the substrate, but it is not limited thereto. In an embodiment, a source electrode or a drain electrode of the thin film transistor may be electrically connected to the first electrode or the second electrode. In an embodiment, the light-transmitting electrode may be disposed on a (e.g., insulating) transparent substrate. The substrate 100 may be a rigid or a flexible substrate.

The light-transmitting electrode may be made of, for example, a transparent conductor such as indium tin oxide (ITO) or indium zinc oxide (IZO), gallium indium tin oxide, zinc indium tin oxide, titanium nitride, polyaniline, LiF/Mg:Ag, or the like, or a metal thin film of a single layer or a plurality of layers but is not limited thereto. In an embodiment, one of the first electrode or the second electrode may be an opaque electrode, the opaque electrode may be made of an opaque conductor such as aluminum (Al), a lithium-aluminum (Li:Al) alloy, a magnesium-silver (Mg:Ag) alloy, and lithium fluoride-aluminum (LiF:Al).

The thickness of each electrode (the first electrode, the second electrode, or a combination thereof) is not particularly limited and may be appropriately selected taking into consideration device efficiency. For example, the thickness of the electrode may be greater than or equal to about 5 nm, greater than or equal to about 10 nm, greater than or equal to about 20 nm, greater than or equal to about 30 nm, greater than or equal to about 40 nm, or greater than or equal to about 50 nm. For example, the thickness of the electrode may be less than or equal to about 100 micrometers (μm), less than or equal to about 90 μm, less than or equal to about 80 μm, less than or equal to about 70 μm, less than or equal to about 60 μm, less than or equal to about 50 μm, less than or equal to about 40 μm, less than or equal to about 30 μm, less than or equal to about 20 μm, less than or equal to about 10 μm, less than or equal to about 1 μm, less than or equal to about 900 nm, less than or equal to about 500 nm, or less than or equal to about 100 nm.

The light emitting layer 3, 30 disposed between the first electrode 1 and the second electrode 5 (e.g., the anode 10 and the cathode 50) may include a plurality of semiconductor nanoparticles (e.g., blue light emitting nanoparticles, red light emitting nanoparticles, green light emitting nanoparticles, or a combination thereof). In an embodiment, the semiconductor nanoparticles may not comprise cadmium. The light emitting layer may include one or more (e.g., 2 or more or 3 or more and 10 or less) monolayers of the plurality of semiconductor nanoparticles.

The light emitting layer may be patterned (not shown). In an embodiment, the patterned light emitting layer may include a blue light emitting layer disposed in the blue pixel. In an embodiment, the light emitting layer may further include a red light emitting layer disposed in the red pixel or a green light emitting layer disposed in the green pixel. In an embodiment, the light emitting layer may include a red light emitting layer disposed in the red pixel and a green light emitting layer disposed in the green pixel. Each of the (e.g., red, green, or blue) light emitting layers may be (e.g., optically) separated from an adjacent light emitting layer by a partition wall. In an embodiment, partition walls such as black matrices may be disposed between the red light emitting layer, the green light emitting layer, and the blue light emitting layer. The red light emitting layer, the green light emitting layer, and the blue light emitting layer may be optically isolated from each other.

In an embodiment, the light emitting layer 3, 30 or the semiconductor nanoparticle may not include cadmium. In an embodiment, the light emitting layer 3, 30 or the semiconductor nanoparticle may not include mercury, lead, or a combination thereof.

In an embodiment, the semiconductor nanoparticle may have a core-shell structure. In an embodiment, the semiconductor nanoparticle or the core-shell structure may include a core including a first semiconductor nanocrystal and a shell disposed on the core and including a second semiconductor nanocrystal and having a composition different from that of the first semiconductor nanocrystal.

The semiconductor nanoparticle (or the first semiconductor nanocrystal, the second semiconductor nanocrystal, or a combination thereof) may include a Group II-VI compound, a Group III-V compound, a Group IV-VI compound, a Group IV element or compound, a Group I-III-VI compound, a Group II-III-VI compound, a Group I-II-IV-VI compound, or a combination thereof. In an embodiment, the light emitting layer or the semiconductor nanoparticle (e.g., the first semiconductor nanocrystal or the second semiconductor nanocrystal) may not include cadmium. In an embodiment, the light emitting layer or the semiconductor nanoparticle (e.g., the first semiconductor nanocrystal or the second semiconductor nanocrystal) may not include lead. In an embodiment, the light emitting layer or the semiconductor nanoparticle (e.g., the first semiconductor nanocrystal or the second semiconductor nanocrystal) may not include a combination of lead and cadmium.

The Group II-VI compound may be a binary element compound such as ZnS, ZnSe, ZnTe, ZnO, HgS, HgSe, HgTe, MgSe, MgS, or a combination thereof; a ternary element compound such as ZnSeS, ZnSeTe, ZnSTe, HgSeS, HgSeTe, HgSTe, HgZnS, HgZnSe, HgZnTe, MgZnSe, MgZnS, or a combination thereof; a quaternary element compound such as HgZnTeS, HgZnSeS, HgZnSeTe, HgZnSTe, or a combination thereof; or a combination thereof. The Group II-VI compound may further include a Group III metal.

The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof. The Group III-V compound may further include a Group II metal (e.g., InZnP).

The Group IV-VI compound may be a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof.

Examples of the Group I-III-VI compound may be $CuInSe_2$, $CuInS_2$, CuInGaSe, and CuInGaS, but are not limited thereto.

Examples of the Group I-II-IV-VI compound may be CuZnSnSe, and CuZnSnS, but are not limited thereto.

The Group IV element or compound may include a single-element such as Si, Ge, or a combination thereof; a binary element compound such as SiC, SiGe, or a combination thereof; or a combination thereof.

In an embodiment, the semiconductor nanoparticle or the first semiconductor nanocrystal may include a metal including indium, zinc, or a combination thereof and a non-metal including phosphorus, selenium, tellurium, sulfur, or a combination thereof. In an embodiment, the second semiconductor nanocrystal may include a metal including indium, zinc, or a combination thereof, and a non-metal including phosphorus, selenium, tellurium, sulfur, or a combination thereof.

In an embodiment, a first semiconductor nanocrystal may include InP, InZnP, ZnSe, ZnSeS, ZnSeTe, or a combination thereof; the second semiconductor nanocrystal may include ZnSe, ZnSeS, ZnS, ZnTeSe, or a combination thereof. In an embodiment, the shell may include zinc, sulfur, and optionally selenium in the outermost layer.

In an embodiment, the semiconductor nanoparticle may emit blue or green light and may include a core including ZnSeTe, ZnSe, or a combination thereof and a shell including a zinc chalcogenide (e.g., ZnS, ZnSe, ZnSeS, or a combination thereof). An amount of sulfur in the shell may increase or decrease in a radial direction (from the core toward the surface), e.g., the amount of sulfur may have a concentration gradient wherein the concentration of sulfur varies radially (e.g., decreases or increases in a direction toward the core).

In an embodiment, the semiconductor nanoparticle may emit red or green light, the core may include InP, InZnP, or a combination thereof, and the shell may include a Group II metal including zinc and a non-metal including sulfur, selenium, or a combination thereof.

In an embodiment, as the semiconductor nanoparticle has a core-shell structure, on the interface between the core and the shell, an alloyed interlayer may be present or may not be present. The alloyed interlayer layer may include a homogeneous alloy or may have a concentration gradient. The gradient alloy may have a concentration gradient wherein the concentration of an element of the shell varies radially (e.g., decreases or increases in a direction toward the core).

In an embodiment, the shell may have a composition that varies in a radial direction. In an embodiment, the shell may be a multilayered shell including two or more layers. In a multilayered shell, adjacent two layers may have different compositions from each other. In a multilayered shell, a, e.g., at least one, layer may independently include a semiconductor nanocrystal having a single composition. In a multilayered shell, a, e.g., at least one, layer may independently have an alloyed semiconductor nanocrystal. In a multilayered shell, a, e.g., at least one, layer may have a concentration gradient that varies radially in terms of a composition of a semiconductor nanocrystal.

In an embodiment, in a semiconductor nanoparticle having a core-shell structure, a shell material may have a bandgap energy that is larger, e.g., greater, than that of the core. The materials of the shell may have a bandgap energy that is smaller, e.g., less, than that of the core. In the case of a multilayered shell, the bandgap energy of the outermost layer material of the shell may be greater than the bandgap energies of the core and the inner layer material of the shell (layers that are closer to the core). In the case of a multilayered shell, a semiconductor nanocrystal of each layer is selected to have an appropriate bandgap, thereby effectively showing, e.g., exhibiting, a quantum confinement effect.

The semiconductor nanoparticle according to an embodiment may include, for example, an organic ligand which is bonded or coordinated to a surface thereof.

An absorption/emission wavelength of the semiconductor nanoparticle may be controlled by adjusting the compositions, sizes, or a combination thereof of the semiconductor nanoparticle. The semiconductor nanoparticle included in the light emitting layer 3, 30 may be configured to emit light of a desired color. The semiconductor nanoparticle may include a blue light emitting semiconductor nanoparticle, a green light emitting semiconductor nanoparticle, or a red light emitting semiconductor nanoparticle.

In an embodiment, a maximum emission peak wavelength of the semiconductor nanoparticle or a light emission layer (or the light emitted from the electroluminescent device) may be in a wavelength range of from ultraviolet to infrared.

In an embodiment, a maximum emission peak wavelength of the semiconductor nanoparticle or the light emitting layer (or the light emitted from the electroluminescent device) may be greater than or equal to about 300 nm, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum emission peak wavelength of the semiconductor nanoparticle or a light emission layer (or the light emitted from the electroluminescent device) may be less than or equal to about 900 nm, less than or equal to about 800 nm, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum emission peak wavelength of the semiconductor nanoparticle or a light emission layer (or the light emitted from the electroluminescent device) may be from about 500 nm to about 650 nm.

The semiconductor nanoparticle (or the light emitted from the electroluminescent device) may emit green light (for example, on an application of a voltage or irradiation with light) and a maximum emission peak wavelength thereof may be in the range of greater than or equal to about 500 nm (for example, greater than or equal to about 510 nm, or greater than or equal to about 515 nm) and less than or equal to about 560 nm, for example, less than or equal to about 540 nm, or less than or equal to about 530 nm.

The semiconductor nanoparticle (or the light emitted from the electroluminescent device) may emit red light, (for example, on an application of voltage or irradiation with light), and a maximum emission peak wavelength thereof may be in the range of greater than or equal to about 600 nm, for example, greater than or equal to about 610 nm and less than or equal to about 650 nm, or less than or equal to about 640 nm.

The semiconductor nanoparticle (or the light emitted from the electroluminescent device) may emit blue light, (for example, on an application of voltage or irradiation with light) and a maximum emission peak wavelength thereof may be greater than or equal to about 430 nm (for example, greater than or equal to about 450 nm, greater than or equal to about 455 nm, greater than or equal to about 460 nm, greater than or equal to about 465 nm) and less than or equal to about 480 nm (for example, less than or equal to about 475 nm, less than or equal to about 470 nm, or less than or equal to about 465 nm).

In an embodiment, the semiconductor nanoparticle may exhibit a luminescent spectrum (e.g., photo- or electroluminescent spectrum) with a relatively narrow full width at half maximum. In an embodiment, in the photo- or electroluminescent spectrum, the semiconductor nanoparticle may exhibit a full width at half maximum of less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, or less than or equal to about 35 nm. The full width at half maximum may be greater than or equal to about 10 nm, greater than or equal to about 15 nm, greater than or equal to about 20 nm, or greater than or equal to about 25 nm.

The semiconductor nanoparticle may exhibit (or may be configured to exhibit) a quantum efficiency (or quantum yield) of greater than or equal to about 10%, for example, greater than or equal to about 30%, greater than or equal to about 50%, greater than or equal to about 60%, greater than or equal to about 70%, greater than or equal to about 80%, greater than or equal to about 90%, or about 100%.

The semiconductor nanoparticle may have a size (or an average size, hereinafter, can be simply referred to as "size") of greater than or equal to about 1 nm and less than or equal to about 100 nm. The size may be a diameter or equivalent diameter converted by assuming a spherical shape from an electron microscope image when not spherical. The size may be calculated from a result of an inductively coupled plasma atomic emission spectroscopy (ICP-AES) analysis. In an embodiment, the semiconductor nanoparticle may have a size of from about 1 nm to about 50 nm, for example, from about 2 nm (or about 3 nm) to about 35 nm. In an embodiment, a size (or an average size) of the semiconductor nanoparticle may be greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, or greater than or equal to about 12 nm. In an embodiment, a size (or an average size) of the semiconductor nanoparticle may be less than or equal to about 50 nm, less than or equal to about 40 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, or less than or equal to about 12 nm.

The shape of the semiconductor nanoparticle or the semiconductor nanostructure is not particularly limited. For example, the shape of the semiconductor nanoparticle may include, but is not limited to, a sphere, a polyhedron, a pyramid, a multi-pod shape, a hexahedron, a cube, a cuboid, a nanotube, a nanorod, a nanowire, a nanosheet, or a combination thereof.

The semiconductor nanoparticle may be prepared in an appropriate method. The semiconductor nanoparticle may be prepared for example by a chemical wet method wherein a nanocrystal particle may grow by a reaction between precursors in a reaction system including an organic solvent and an organic ligand. The organic ligand or the organic solvent may coordinate (with or to) a surface of the semiconductor nanocrystal to control the growth thereof.

In an embodiment, for example, the method of preparing the semiconductor nanoparticle having a core/shell structure may include obtaining the core; reacting a first shell precursor including a metal (e.g., zinc) and a second shell precursor including a non-metal element (e.g., selenium, sulfur, or a combination thereof) in the presence of the core in a reaction medium including an organic ligand and an organic solvent at a reaction temperature (e.g., of greater than or equal to about 180° C., greater than or equal to about 200° C., greater than or equal to about 240° C., or greater than or equal to about 280° C. and less than or equal to about 360° C., less than or equal to about 340° C., or less than or equal to about 320° C.) to form a shell including a second semiconductor nanocrystal on a core including a first semiconductor nanocrystal. The method may further include separating a core from a reaction system producing the same and dispersing the core in an organic solvent to obtain a core solution.

In an embodiment, in order to form the shell, a solvent and optionally, the first shell precursor and a ligand compound may be heated at a predetermined temperature (e.g., greater than or equal to about 100° C.) under vacuum (also referred to herein as vacuum-treated) and then, after introducing an inert gas into the reaction vessel, the mixture may be heat-treated again at a predetermined temperature (e.g., greater than or equal to 100° C.). Then, the core and the second shell precursor may be added to the mixture and heated at a reaction temperature. The shell precursors may be added at different ratios during a reaction time simultaneously or sequentially.

In the semiconductor nanoparticle of an embodiment, the core may be prepared in an appropriate manner. In an embodiment, the organic solvent may include a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with a, e.g., at least one (e.g., 1, 2, or 3), C6 to C22 alkyl group, a phosphine oxide (e.g., trioctylphosphine oxide) substituted with a (e.g., 1, 2, or 3) C6 to C22 alkyl group, a C12 to C22 aromatic ether such as phenyl ether or benzyl ether, or a combination thereof. A combination including more than one type of organic solvent may be used.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, $R_2POOH$ or a combination thereof. Herein, R and R' are each independently a substituted or unsubstituted, C3 or greater, C6 or greater, or C10 or greater and about C40 or less, C35 or less, or C25 or less, aliphatic hydrocarbon group (e.g., alkyl, alkenyl, alkynyl, etc.), a substituted or unsubstituted C6 to C40 aromatic hydrocarbon group (e.g., aryl group), or a combination thereof. In an embodiment, at least two different organic ligands may be used.

In an embodiment, after completing the reaction (for the formation of the core or for the formation of the shell), a nonsolvent is added to reaction products and a nanoparticle coordinated with the ligand compound may be separated. The nonsolvent may be a polar solvent that is miscible with the solvent used in the core formation reactions, shell formation reaction, or a combination thereof and is not capable of dispersing the prepared nanocrystals. The nonsolvent may be selected depending on the solvent used in the reaction and may include, for example, acetone, ethanol, butanol, isopropanol, ethanediol, water, tetrahydrofuran (THF), dimethylsulfoxide (DMSO), diethylether, formaldehyde, acetaldehyde, ethylene glycol, a solvent having a similar solubility parameter to the foregoing nonsolvents, or a combination thereof. The semiconductor nanocrystal particles may be separated through centrifugation, sedimentation, or chromatography. The separated nanocrystals may be washed with a washing solvent, if desired. The washing solvent has no particular limit and may have a similar solubility parameter to that of the ligand and may, for example, include hexane, heptane, octane, chloroform, toluene, benzene, and the like.

The semiconductor nanoparticles of an embodiment may be non-dispersible or insoluble in water, the aforementioned nonsolvent, or a combination thereof. The semiconductor nanoparticles of an embodiment may be dispersed in the aforementioned organic solvent. In an embodiment, the aforementioned semiconductor nanoparticles may be dispersed in a C6 to C40 aliphatic hydrocarbon, a substituted or unsubstituted C6 to C40 aromatic hydrocarbon, or a combination thereof.

The prepared semiconductor nanoparticles may be treated with a halogen compound. By the treatment with the halogen compound, at least a portion of the organic ligand may be replaced with the halogen. The halogen treated semiconductor nanoparticles may include a reduced amount of the organic ligand. The halogen treatment may be carried out contacting the semiconductor nanoparticles with the halogen compound (e.g., a metal halide such as a zinc chloride) at a predetermined temperature of from about 30° C. to about 100° C. or from about 50° C. to about 150° C. in an organic solvent. The halogen-treated semiconductor nanoparticles may be separated using the non-solvent described above.

In the electroluminescent device or the display device of an embodiment, a thickness of the light emitting layer may be appropriately selected. The light emitting layer may have a thickness of greater than or equal to about 5 nm, for example, greater than or equal to about 10 nm, greater than or equal to about 20 nm, or greater than or equal to about 30 nm and less than or equal to about 200 nm, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The light emitting layer may have a thickness of, for example, about 10 nm to about 150 nm, about 20 nm to about 100 nm, or about 30 nm to about 50 nm.

In an embodiment, the light emitting layer may include a monolayer of nanoparticles. In an embodiment, the light emitting layer may include one or more, for example, two or more, three or more, or four or more and 20 or less, 10 or less, 9 or less, 8 or less, 7 or less, or 6 or less monolayers of nanoparticles.

In an embodiment, the forming of the light emitting layer including the semiconductor nanoparticles may be performed by obtaining a coating liquid including semiconductor nanoparticles and an organic solvent (e.g., an alkane solvent such as octane, heptane, or the like, an aromatic solvent such as toluene, or a combination thereof) and applying or depositing the coating liquid on a substrate or charge auxiliary layer (e.g., a hole auxiliary layer) in an appropriate manner (e.g., by spin coating, inkjet printing, etc.). A type of the organic solvent for the coating liquid is not particularly limited and may be selected appropriately. In an embodiment, the organic solvent may include a substituted or unsubstituted aliphatic hydrocarbon, a substituted or unsubstituted aromatic hydrocarbon, a substituted or unsubstituted alicyclic hydrocarbon, an acetate solvent, or a combination thereof.

In an embodiment, the formation of the light emitting layer may further include contacting the film of the semiconductor nanoparticles with a metal halide (e.g., a zinc chloride)-containing organic solution (e.g., including an alcohol solvent). In an embodiment, the light emitting layer may include a first light emitting layer including a first semiconductor nanoparticle and a second light emitting layer including a second semiconductor nanoparticle, wherein the first semiconductor nanoparticle has a halogen (e.g., chlorine) exchanged surface and the second light emitting layer has an increased amount of an organic ligand. A halogen (e.g., chlorine) amount and an organic ligand amount of the light emitting layer may be controlled with an appropriate manner (e.g., a post treatment for the formed layer). In an embodiment, a thin film of the semiconductor nanoparticles having an organic ligand (e.g., having a carboxylic acid group) is formed, which is then treated with a solution including a metal halide (e.g., a zinc halide such as a zinc chloride in alcohol solvent) to control an amount of the organic ligand of the semiconductor nanoparticles in the thin film. The treated thin film may have an increased halogen amount, showing, e.g., exhibiting, a changed property (e.g., solubility) to, e.g., relative to, an organic solvent, and it may be possible to form a layer of semiconductor nanoparticles having a different amount of an organic ligand (e.g., a halogen treated semiconductor nanoparticle or a semiconductor nanoparticle with a ligand having a carboxylic acid group) on the treated thin film, subsequently.

In an embodiment, the light emitting layer may be a single layer or a multi-layered structure having at least two layers. In a multi-layered structure, adjacent layers (e.g., a first light emitting layer and a second light emitting layer) may be configured to emit a first light (e.g., green light, blue light, or red light). In a multi-layered structure, adjacent layers (e.g., a first light emitting layer and a second light emitting layer) may have the same or different composition, ligands, or a combination thereof. In an embodiment, the (multi-layered) light emitting layer may exhibit a halogen content that varies (increase or decrease) in a thickness direction. In an embodiment, in the (multi-layered) light emitting layer, the amount of the halogen may increase in a direction toward the electron auxiliary layer. In the (multi-layered) light emitting layer, the amount of the organic ligand may decrease in a direction toward the electron auxiliary layer. In the (multi-layered) light emitting layer, the content of the organic ligand may increase in a direction toward the electron auxiliary layer.

In an embodiment, the light emitting layer thus formed (or treated with the halogen solution) may be washed with an organic washing solvent (water or an organic solvent miscible with the water). A manner of the washing is not particularly limited and may be conducted by a spin and dry, a dipping, or a combination thereof.

The light emitting layer may be heat-treated. The heat treating may be carried out in air or in an inert gas atmosphere. A temperature of the heat treating may be greater than or equal to about 50° C., greater than or equal to about 70° C., greater than or equal to about 90° C., greater than or equal to about 100° C., greater than or equal to about 120° C., greater than or equal to about 150° C., greater than or equal to about 170° C., or greater than or equal to about 200° C. A temperature of the heat treating may be less than or equal to about 250° C., less than or equal to about 230° C., less than or equal to about 200° C., less than or equal to about 180° C., less than or equal to about 160° C., less than or equal to about 140° C., or less than or equal to about 130° C.

The electroluminescent device of an embodiment includes an electron auxiliary layer 4, 40 disposed on the light emitting layer 3, 30, for example, between the light emitting layer and the second electrode 5, 50. In the electron auxiliary layer 4, 40, transporting, injecting, or transporting and injecting of electrons may occur. The electron auxiliary layer 4, 40 includes an electron transport layer (ETL). The electron transport layer includes a (plurality of) metal oxide nanoparticles. The electron auxiliary layer 4, 40 may further include an electron injection layer, a hole blocking layer, or a combination thereof. The electron injection layer, the hole blocking layer, or a combination thereof may be disposed between the electron transport layer and the second electrode, but it is not limited thereto. In an embodiment, the hole blocking layer may be disposed between the electron injection layer and the electron transport layer. In an embodiment, the electron injection layer may be disposed between the hole blocking layer and the electron transport layer. The electron transport layer may be adjacent (e.g., directly adjacent or directly disposed on) the light emitting layer. In an embodiment, the light emitting layer 3, 30 may contact the electron transport layer.

The second electrode 5, 50 may have a first surface facing a surface of the electron transport layer (or the electron auxiliary layer) and a second surface opposite to the first surface. The organic layer 6, 60 may be disposed on (e.g. to cover) at least a portion (or the entire) of the surface of the electron transport layer (or the electron auxiliary layer). The organic layer 6, 60 may be disposed on (e.g. to cover) at least a portion (or the entire) of the second surface of the second electrode. The organic layer 6, 60 may be disposed on (e.g. to cover) at least a portion (or the entire) of the surface of the electron transport layer (or the electron auxiliary layer 4, 40) and at least a portion (or the entire) of the second surface of the second electrode 5, 50.

The metal oxide (nanoparticle) may include a zinc oxide. The metal oxide (nanoparticle) or the zinc oxide may include zinc; and optionally a Group IIA metal, Zr, W, Li, Ti, Y, Al, gallium, indium, tin (Sn), cobalt (Co), vanadium (V), or a combination thereof. The metal oxide (nanoparticle) or the zinc oxide may include zinc, a Group IIA metal, and optionally an alkali metal.

The metal oxide (nanoparticle) or the zinc oxide may include a compound represented by $Zn_{1-x}M_xO$, wherein, M is Mg, Ca, Zr, Co, W, Li, Ti, Y, Al, or a combination thereof, and $0 \leq x \leq 0.5$. The x may be greater than or equal to about 0.01, greater than or equal to about 0.03, greater than or equal to about 0.05, greater than or equal to about 0.07, greater than or equal to about 0.1, greater than or equal to about 0.13, greater than or equal to about 0.15, greater than or equal to about 0.17, greater than or equal to about 0.2, greater than or equal to about 0.23, or greater than or equal to about 0.25. The x may be less than or equal to about 0.47, less than or equal to about 0.45, less than or equal to about 0.43, less than or equal to about 0.4, less than or equal to about 0.37, less than or equal to about 0.35, or less than or equal to about 0.3. The metal oxide or the zinc oxide may further include magnesium. The electron transport layer or the zinc oxide may include $Zn_{1-x}Mg_xO$ (x is greater than or equal to 0, or greater than 0 and less than or equal to about 0.5, the x is the same as defined herein), ZnO, or a combination thereof. The zinc oxide may further include magnesium.

A size or an average size (hereinafter, referred to as "size") of the metal oxide nanoparticle(s) may be greater than or equal to about 1 nm, greater than or equal to about 2 nm, greater than or equal to about 2.5 nm, greater than or equal to about 3 nm, or greater than or equal to about 3.5 nm and less than or equal to about 10 nm, less than or equal to about 9 nm, less than or equal to about 8 nm, less than or equal to about 7 nm, less than or equal to about 6 nm, less than or equal to about 5 nm, or less than or equal to about 4.5 nm.

In an embodiment, the metal oxide nanoparticle (e.g., the zinc oxide nanoparticle) may be prepared in any proper method, which is not particularly limited. The preparation of the metal oxide nanoparticles may include a solgel reaction. In an embodiment, the zinc oxide (e.g., zinc magnesium oxide) nanoparticle may be prepared by placing a zinc compound (e.g., an organic zinc compound such as zinc acetate dihydrate) and optionally an additional metal compound (e.g., an organic additional metal compound such as magnesium acetate tetrahydrate) in an organic solvent (e.g., dimethylsulfoxide) in a flask to have a desired mole ratio and heating the same at a predetermined temperature (e.g., from about 40° C. to about 120° C., or from about 60° C. to about 100° C.) (e.g., in air), and adding a precipitation accelerator solution (for example, a solution of tetramethyl ammonium hydroxide pentahydrate and ethanol) at a predetermined rate with, e.g., while, stirring. The prepared zinc oxide nanoparticle (e.g., $Zn_xMg_{1-x}O$ nanoparticle) may be recovered from a reaction solution for example via centrifugation.

In an embodiment, the electron auxiliary layer or the electron transport layer may be prepared in a solution process. In an embodiment, the electron auxiliary layer or the electron transport layer may be prepared by dispersing a plurality of metal oxide nanoparticles in an organic solvent (for example, a polar solvent, a non-polar solvent, or a combination thereof) to obtain an electron transport layer precursor dispersion, which is then applied to a surface to form a film. The electron transport layer precursor dispersion may be applied to the light emitting layer. The solution process may further include removing the organic solvent from the formed film for example by evaporation. The organic solvent may include a C1 to C10 alcohol solvent or a combination thereof.

In an embodiment, a thickness of the electron transport layer (ETL) may be greater than or equal to about 3 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, greater than or equal to about 21 nm, greater than or equal to about 22 nm, greater than or equal to about 23 nm, greater than or equal to about 24 nm, greater than or equal to about 25 nm, greater than or equal to about 26 nm, greater than or equal to about 27 nm, greater than or equal to about 28 nm, greater than or equal to about 29 nm, greater than or equal to about 30 nm, greater than or equal to about 31 nm, greater than or equal to about 32 nm, greater than or equal to about 33 nm, greater than or equal to about 34 nm, or greater than or equal to about 35 nm. The thickness of the electron transport layer may be less than or equal to about 90 nm, less than or equal to about 80 nm, less than or equal to about 70 nm, less than or equal to about 60 nm, less than or equal to about 50 nm, less than or equal to about 45 nm, less than or equal to about 40 nm, or less than or equal to about 35 nm.

The thickness of the electron injection layer, the hole blocking layer, or a combination thereof is not particularly limited and may be appropriately selected. A thickness of the electron injection layer, the hole blocking layer, or a combination thereof may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, or greater than or equal to about 21 nm and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

In an embodiment, a material for the electron injection layer, the hole blocking layer, or a combination thereof may include 1,4,5,8-naphthalene-tetracarboxylic dianhydride (NTCDA), bathocuproine (BCP), tris[3-(3-pyridyl)-mesityl]borane (3TPYMB), LiF, tris(8-hydroxyquinolinato)aluminum ($Alq_3$), tris(8-hydroxyquinolinato)gallium ($Gaq_3$), tris(8-hydroxyquinolinato)indium ($Inq_3$), bis-(8-hydroxyquinolinato)zinc ($Znq_2$), bis[2-(2-hydroxyphenyl)benzothiazolato]zinc ($Zn(BTZ)_2$), bis(10-hydroxybenzo[H]quinolinato)beryllium ($BeBq_2$), 8-(4-(4,6-di(naphthalen-2-yl)-1,3,5-triazin-2-yl)phenyl)quinolone (ET204), 8-hydroxyquinolinato lithium (Liq), 2,2',2"-(1,3,5-Benzinetriyl)-tris(1-phenyl-1-H-benzimidazole) (TPBi), an n-type metal oxide (e.g., ZnO, $HfO_2$, etc.), 8-(4-(4,6-di(naphthalen-2-yl)-1,3,5-triazin-2-yl)phenyl)quinolone:8-hydroxyquinolinato lithium (ET204:Liq), or a combination thereof, but is not limited thereto.

In the electron transport layer, the metal oxide nanoparticle may provide higher electron mobility than an organic semiconductor material, and the light emitting layer, for example, being combined with the electron transport layer including the metal oxide nanoparticle, may exhibit a desired level of an electroluminescent property. In addition, the semiconductor nanoparticle-based emission layer may be formed by a solution process, and the metal oxide nanoparticle-based electron transport layer may be formed on the emission layer by a solution process, thereby being advantageous in the process.

However, the inventors have found that the combination of an electron auxiliary layer including metal oxide nanoparticles and a light emitting layer including semiconductor nanoparticles may not provide desired improvements both in electroluminescence properties and lifespan characteristics at the same time. For example, a metal oxide nanoparticle (e.g., a zinc magnesium oxide nanoparticle) may be grown through a sol-gel reaction involving a precursor (e.g., $Zn(CH_3COO)_2$, $Mg(CH_3COO)_2$) in the presence of a base. Without wishing to be bound by any theory, it is believed that various surface chemical species such as metal ions, for example, ($Zn^{2+}$, $Mg^{2+}$), $O^{2-}$, —OH, $CH_3COO^-$, may exist on a surface of a metal oxide nanoparticle as a result of the synthesis, and these surface chemical species may be a source of surface defects for the nanoparticle, acting as a defect level in the ETL. Without wishing to be bound by any theory, the surface defect present on the metal oxide (e.g., ZnMgO) particle may have an energy level near the HOMO level of the quantum dot or the semiconductor nanoparticle, and therefore, may serve as a trap site for holes and may cause an increase in leakage current.

The metal oxide nanoparticle in the electron auxiliary layer or the electron transport layer may include various defects occurring in its manufacturing process and the film formation process, and these defects may provide various levels within the nanoparticles to be used as a passage for a hole movement, and therefore, a metal oxide nanoparticle-based electron transport layer may exhibit a reduced hole blocking performance or relatively high hole leakage current, which may adversely affect the electroluminescence property (e.g., a luminous efficiency) of the device.

In addition, without wishing to be bound by any theory, the surface defect possibly present in the metal oxide nanoparticle may cause a lot of charge accumulation at an interface between the electron transport layer and the light emitting layer or in the electron transport layer, leading to a luminance decrease or a shortened lifespan of the electroluminescent device including a quantum dot.

In addition, the present inventors have found that the electroluminescent device including a semiconductor nanoparticle based light emitting layer and a metal oxide nanoparticle based electron transport layer may not exhibit a sufficient level of a current flow at a predetermined voltage.

In an embodiment, the electroluminescent device may include an organic layer on the electron transport layer or the electron auxiliary layer including the ETL. The organic layer includes a polymeric acid compound. In an embodiment, the electron transport layer including a metal oxide nanoparticle or the electron auxiliary layer including the ETL has a first surface facing the light emitting layer and a second surface opposite to the first surface, and the organic layer may be disposed on (may contact with) at least a portion or the entire of the second surface of the electron transport layer or the electron auxiliary layer including the ETL. Surprisingly, the inventors have found that the presence of the organic layer described herein may address the technical drawbacks referred to above. Incorporating the organic layer in the device of an embodiment may address one or more of the above technical issues associated with the ETL and metal oxide nanoparticles.

Without wishing to be bound by any theory, it is believed that the polymeric acid included in the organic layer may induce a modification (e.g., surface modification) of a metal oxide nanoparticle contained in the electron transport layer, thereby effectively reducing hole leakage current and solving the charge accumulation and the consequent charging problem. It is believed that the polymeric acid compound contained in the organic layer may contain moisture (e.g., in a limited amount), and the acid component and/or the moisture may induce a surface chemical reaction of metal oxide nanoparticles in the electron transport layer. The acid component and/or the moisture may be capable of passivating the surface defects on the nanoparticles, which in turn, may provide an increase in the conductivity of the metal oxide nanoparticle. Accordingly, the light emitting device of an embodiment including the electron transport layer on which the organic layer is disposed may exhibit an extended lifespan together with an improved emission efficiency.

In an embodiment, the acid component of the polymeric acid compound and the moisture in the organic layer formed e.g., disposed on the top of the QD-LED stack may diffuse into the electron transport layer containing the metal oxide (e.g., ZnMgO) nanoparticles. Without wishing to be bound by any theory, it is believed that hydrogen ions and/or moisture components provided by the polymeric acid compound may provide a passivation of surface defects of the nanoparticles via a chemical reaction, decreasing the number of trap sites. It is believed that the introduction of the organic layer including the polymeric acid compound may suppress a leakage current of holes generated from the trap site of metal oxide (e.g., ZnMgO) nanoparticle, and thereby, the hole blocking ability of the metal oxide-based electron transport layer may be improved. It is believed that, in the electroluminescent device of an embodiment, the organic layer may improve upon the efficiency of the hole-electron recombination thereby contributing to an improvement in the external quantum efficiency of the electroluminescent device.

The organic layer may induce a surface modification of the metal oxide nanoparticles present in the metal oxide-based electron transport layer. Consequently, the electron transport layer is likely to include metal oxide nanoparticles with a reduced number of trap sites. Accordingly, in the electroluminescent device of an embodiment, the charge accumulation and the consequent unwanted charging phenomenon caused by the trap sites may be suppressed or prevented. Moreover, the deterioration of the semiconductor nanoparticles and the electron transport material over time may be suppressed, and the device may exhibit improved (e.g., extended) lifespan.

In an embodiment, the polymeric acid compound may include, (for example, in a repeating unit of the compound) a carboxylic acid group (e.g., COOH), a phosphonic acid group ($PO(OH)_2$), a sulfonic acid group ($SO_3H$), or a combination thereof.

In an embodiment, the polymeric acid compound included in the organic layer may have an average molecular weight of greater than or equal to about 800 g/mol, greater than or equal to about 900 g/mol, greater than or equal to about 1000 g/mol, greater than or equal to about 1100 g/mol, greater than or equal to about 1200 g/mol, greater than or equal to about 1300 g/mol, greater than or equal to about 1400 g/mol, greater than or equal to about 1500 g/mol, greater than or equal to about 1600 g/mol, greater than or equal to about 1700 g/mol, greater than or equal to about 1800 g/mol, greater than or equal to about 1900 g/mol, greater than or equal to about 2000 g/mol, greater than or equal to about 2100 g/mol, greater than or equal to about 2200 g/mol, greater than or equal to about 2300 g/mol, greater than or equal to about 2400 g/mol, greater than or equal to about 2500 g/mol, greater than or equal to about 3000 g/mol, greater than or equal to about 3500 g/mol, greater than or equal to about 4000 g/mol, greater than or equal to about 4500 g/mol, greater than or equal to about 5000 g/mol, greater than or equal to about 5500 g/mol, greater than or equal to about 6000 g/mol, greater than or equal to about 7000 g/mol, greater than or equal to about 8000 g/mol, greater than or equal to about 9000 g/mol, greater than or equal to about 10000 g/mol, greater than or equal to about 15000 g/mol, greater than or equal to about 20000 g/mol, greater than or equal to about 25000 g/mol, greater than or equal to about 30000 g/mol, greater than or equal to about 35000 g/mol, greater than or equal to about 40000 g/mol, greater than or equal to about 45000 g/mol, greater than or equal to about 50000 g/mol, greater than or equal to about 55000 g/mol, greater than or equal to about 60000 g/mol, greater than or equal to about 65000 g/mol, greater than or equal to about 70000 g/mol, greater than or equal to about 75000 g/mol, greater than or equal to about 80000 g/mol, greater than or equal to about 85000 g/mol, greater than or equal to about 90000 g/mol, greater than or equal to about 95000 g/mol, greater than or equal to about 100000 g/mol, greater than or equal to about 120000 g/mol, greater than or equal to about 140000 g/mol, greater than or equal to about 160000 g/mol, greater than or equal to about 180000 g/mol, greater than or equal to about 200000 g/mol, greater than or equal to about 220000 g/mol, greater than or equal to about 240000 g/mol, greater than or equal to about 260000 g/mol, greater than or equal to about 280000 g/mol, greater than or equal to about 300000 g/mol, greater than or equal to about 350000 g/mol, greater than or equal to about 400000 g/mol, or greater than or equal to about 450000 g/mol, or a combination thereof.

The average molecular weight of the polymeric acid compound may be less than or equal to about 8000000 g/mol, less than or equal to about 7000000 g/mol, less than or equal to about 6000000 g/mol, less than or equal to about 5000000 g/mol, less than or equal to about 4000000 g/mol, less than or equal to about 3000000 g/mol, less than or equal to about 2000000 g/mol, less than or equal to about 1500000 g/mol, less than or equal to about 1200000 g/mol, less than or equal to about 1000000 g/mol, less than or equal to about 900000 g/mol, less than or equal to about 800000 g/mol, less than or equal to about 700000 g/mol, less than or equal to about 600000 g/mol, less than or equal to about 500000 g/mol, less than or equal to about 450000 g/mol, less than or equal to about 200,000 g/mol, less than or equal to about 150,000 g/mol, less than or equal to about 100,000 g/mol, less than or equal to about 90,000 g/mol, less than or equal to about 80,000 g/mol, less than or equal to about 70,000 g/mol, less than or equal to about 50,000 g/mol, or a combination thereof.

The molecular weight of the polymeric acid compound may be obtained in consideration of the molecular weight (e.g., g/mol) and the degree of polymerization of the repeating unit and may exhibit a molecular weight distribution. The average molecular weight of the polymeric acid compound may be an average molecular weight of a polymer, and may be a number average molecular weight, a weight average molecular weight, or a viscosity average molecular weight.

In an embodiment, the average molecular weight of the polymeric acid compound may be measured by using a solution of the polymeric acid compound. In order to reduce interactions between molecules of the polymer, the molecular weight may be measured by a dilute solution. The concentration of the polymer solution may be appropriately selected, and may be measured using, for example, a solution in which 1 gram or less of a polymer is dissolved per 100 mL. The average molecular weight of the polymer may be measured by an appropriate method, such as a gel permeation chromatography, an end group analysis, an osmotic pressure method, a capillary viscosity method, or the like. In a gel permeation chromatography method, a polymer dissolved in a solvent may be separated in accordance with its size and an obtained result can be calibrated using a standard material with a determined molecular weight. In the terminal group analysis method, the molecular weight may be measured by quantifying a carboxyl group by dissolving a polymer in a solvent.

Each measurement method may easily and reproducibly provide substantially the same information on molecular weight using commercially available devices according to established standards.

The number average molecular weight, the weight average molecular weight, and the viscosity average molecular weight of the polymer may be related to each other.

The polymeric acid compound may be commercially available from various manufacturers. The manufacturers provide information about the polymeric acid compound (e.g., a number average molecular weight, a weight average molecular weight, or the like), and thus the polymeric acid compound having a desired level and type of a molecular weight value may be commercially obtained.

The polymeric acid compound may be water soluble and/or alcohol soluble.

In an embodiment, the polymeric acid compound may have a solubility in water or C1 to C10 alcohol, such as ethanol (e.g., at room temperature or at a temperature of 20° C. or at 25° C.) of greater than or equal to about 1 g/L, greater than or equal to about 10 g/L, greater than or equal to about 20 g/L, greater than or equal to about 30 g/L, greater than or equal to about 40 g/L, greater than or equal to about 50 g/L, greater than or equal to about 60 g/L, greater than or equal to about 70 g/L, greater than or equal to about 80 g/L, greater than or equal to about 90 g/L, greater than or equal to about 100 g/L, greater than or equal to about 110 g/L, greater than or equal to about 120 g/L, greater than or equal to about 130 g/L, greater than or equal to about 140 g/L, greater than or equal to about 150 g/L, greater than or equal to about 160 g/L, greater than or equal to about 170 g/L, greater than or equal to about 180 g/L, greater than or equal to about 190 g/L, greater than or equal to about 200 g/L, greater than or equal to about 210 g/L, greater than or equal to about 220 g/L, greater than or equal to about 230 g/L, greater than or equal to about 240 g/L, greater than or equal to about 250 g/L, greater than or equal to about 260 g/L, greater than or equal to about 270 g/L, greater than or equal to about 280 g/L, greater than or equal to about 290 g/L, greater than or equal to about 300 g/L, or a combination thereof, but is not limited thereto.

In an embodiment, the polymeric acid compound may have a solubility in water or C1 to C10 alcohol, such as ethanol (e.g., at room temperature or at a temperature of 20° C. or at 25° C.) of less than or equal to about 1000 g/L, less than or equal to about 900 g/L, less than or equal to about 800 g/L, less than or equal to about 700 g/L, less than or equal to about 600 g/L, less than or equal to about 500 g/L, less than or equal to about 400 g/L, less than or equal to about 300 g/L, less than or equal to about 200 g/L, or a combination thereof, but is not limited thereto.

In an embodiment, the polymeric acid compound may have a relatively high level of solubility with respect to water or a water miscible organic solvent e.g., an alcohol solvent, and a viscosity of a composition or a coating solution for forming the organic layer may be relatively readily controlled to form an organic layer. Therefore, a higher degree of flexibility to form a film may be realized in comparison with an adhesive composition with a relatively high viscosity (e.g., a curable resin-based composition).

In an embodiment, the polymeric acid compound may be configured to exhibit, in an aqueous or alcoholic solution state, a pH of less than or equal to about 5, less than or equal to about 4.9, less than or equal to about 4.7, less than or equal to about 4.4, less than or equal to about 4.2, less than or equal to about 4, less than or equal to about 3.8, less than or equal to about 3.6, less than or equal to about 3.4, less than or equal to about 3.2, less than or equal to about 3, less than or equal to about 2.8, less than or equal to about 2.6, less than or equal to about 2.4, less than or equal to about 2, less than or equal to about 1.8, less than or equal to about 1.7, less than or equal to about 1.6, less than or equal to about 1.55, less than or equal to about 1.5, or less than or equal to about 1. In an embodiment, the polymeric acid compound may be configured to exhibit, in an aqueous or alcoholic solution state, a pH of greater than or equal to about 0.5, greater than or equal to about 1, greater than or equal to about 1.5, greater than or equal to about 1.8, greater than or equal to about 2, greater than or equal to about 2.5, greater than or equal to about 3, greater than or equal to about 3.5, greater than or equal to about 4, greater than or equal to about 4.5, or greater than or equal to about 4.8. In the aqueous or alcoholic solution of the polymeric acid compound, a concentration of the polymeric acid compound may be from about 5 wt % to about 80 wt %, from about 10 wt % to about 75 wt %, from about 15 wt % to about 70 wt %, from about 18 wt % to about 65 wt %, from about 20 wt % to about 60 wt %, from about 25 wt % to about 55 wt %, from about 30 wt % to about 50 wt %, or a combination thereof.

The polymeric acid compound may include a polyacrylic acid, a polymethacrylic acid, a polyacrylic acid-methacrylic acid, a polyacrylic acid (partial or full) alkali metal salt, a copolymer including a (meth)acrylic acid repeating unit, a polyvinyl phosphonic acid compound, a poly(aromatic sulfonic acid), a poly(vinyl sulfonic acid) compound, a polymaleic acid, or a combination thereof (e.g., a copolymer or mixture thereof). The polymeric acid compound may further include an ester of the corresponding acid group (i.e., —COOR, R is an alkyl group or an aryl group). The poly(aromatic sulfonic acid) may include a polystyrene sulfonic acid (e.g., a poly(4-styrenesulfonic acid), a polystyrene sulfonic acid-co-maleic acid (e.g., poly(4-styrene sulfonic acid-co-maleic acid), an alkali metal salt thereof, or a combination thereof.

The organic layer may further include or may not include an additive. The additive may include an inorganic acid such as a hydrochloric acid, a phosphoric acid, a carbonic acid, or a sulfuric acid; a C2-50 carboxylic acid compound (e.g., represented by $R(COOH)_n$), a sulfinic acid compound (e.g., represented by $R(SO_2H)_n$), a sulfonic acid compound (e.g., represented by $R(SO_3H)_n$), or a combination thereof. In the formulae, the R may be a substituted or unsubstituted C1 to C50 aliphatic or aromatic hydrocarbon group, for example, a substituted or unsubstituted alkyl group, a substituted or unsubstituted alkenyl group, a substituted or unsubstituted alkynyl group, or a substituted or unsubstituted aryl group, and the n is an integer of 1 to 10, 2 to 8, or 3 to 6. The carboxylic acid compound, the sulfinic acid compound, the sulfonic acid compound, or a combination thereof may further include a hydroxyl group.

The organic layer or the additive may include a polycarboxylic acid compound having two or more carboxylic acid groups. The polycarboxylic acid compound may be non-polymeric compound. The polycarboxylic acid compound may be a compound having 2 to 10 carboxylic acid groups. The polycarboxylic acid compound may have 1 to 10, 2 to 5, 3 to 4 $C_{1-100}$, $C_{2-60}$, or $C_{6-15}$ aliphatic hydrocarbon group(s), 1 to 10, 2 to 5, 3 to 4 $C_{6-15}$ aromatic hydrocarbon group(s), or a combination thereof. The polycarboxylic acid compound may further include a hydroxyl group.

The polycarboxylic acid compound may include a compound represented by $HOOC-A-(COOH)_m$, wherein A is a single bond, a carbon atom, a substituted or unsubstituted C1 to C100 (C1-C50, C5-C15, C6-C12) aliphatic hydrocarbon group, such as alkylene, alkenylene, or alkynylene, a substituted or unsubstituted C6 to C40 aromatic hydrocarbon group, or a combination thereof, m is greater than or equal to about 1, greater than or equal to about 2, greater than or equal to about 3, or greater than or equal to about 4, and less than or equal to about 10, less than or equal to about 8, less than or equal to about 6, less than or equal to about 3. In the group A, at least one methylene may be replaced with CO, NH, O, COO, CONH, or a combination thereof. The polycarboxylic acid compound may have a carbon number of greater than or equal to about 2, greater than or equal to about 3, greater than or equal to about 4, greater than or equal to about 5, greater than or equal to about 6, greater than or equal to about 7, or greater than or equal to about 8. The polycarboxylic acid compound may have a carbon number of less than or equal to about 100, less than or equal to about 60, less than or equal to about 15, less than or equal to about 14, less than or equal to about 13, less than or equal to about 12, less than or equal to about 11, less than or equal to about 10, less than or equal to about 9, less than or equal to about 8, less than or equal to about 7, less than or equal to about 6, or less than or equal to about 5.

The additive may include benzoic acid, succinic acid, maleic acid, fumaric acid, malic acid, glutaric acid, adipic acid, pimelic acid, citric acid, oxalic acid, malonic acid, phthalic acid, isophthalic acid, terephthalic acid, trimellitic acid, hemimellitic acid, azelaic acid, suberic acid, tartaric acid, itaconic acid, dodecanedioic acid, sulfuric acid, acetic acid, (meth)acrylic acid, or a combination thereof.

In the organic layer, an amount of a crosslinked polymer (e.g., crosslinked poly(meth)acrylate, crosslinked epoxy, crosslinked polysiloxane, crosslinked urethane polymer, a crosslinked thiolene polymer, etc.) may be less than or equal to about 5 wt %, less than or equal to about 3 wt %, less than or equal to about 1 wt %, less than or equal to about 0.9 wt %, less than or equal to about 0.8 wt %, less than or equal to about 0.7 wt %, less than or equal to about 0.6 wt %, less than or equal to about 0.5 wt %, less than or equal to about 0.4 wt %, less than or equal to about 0.3 wt %, less than or equal to about 0.2 wt %, or less than or equal to about 0.1 wt %, based on a total weight of the organic layer. The organic layer may not substantially include the crosslinked polymer.

The organic layer may be configured to be dissolve at least a portion thereof as being immersed in water (or a C1 to C5 alcohol). The temperature of the water (or the temperature of the C1 to C5 alcohol) may be greater than or equal to about 25° C. The temperature of the water (or the temperature of the C1 to C5 alcohol) may be less than or equal to a boiling point thereof (for example, about 50° C. or less, or about 30° C. or less).

In an embodiment, a thickness of the organic layer may be greater than or equal to about 10 nm, greater than or equal to about 30 nm, greater than or equal to about 50 nm, greater than or equal to about 70 nm, greater than or equal to about 90 nm, greater than or equal to about 100 nm, greater than or equal to about 120 nm, greater than or equal to about 140 nm, greater than or equal to about 160 nm, greater than or equal to about 180 nm, greater than or equal to about 200 nm, greater than or equal to about 250 nm, greater than or equal to about 300 nm, greater than or equal to about 350 nm, greater than or equal to about 400 nm, greater than or equal to about 450 nm, greater than or equal to about 500 nm, greater than or equal to about 550 nm, greater than or equal to about 600 nm, greater than or equal to about 650 nm, greater than or equal to about 700 nm, greater than or equal to about 750 nm, greater than or equal to about 800 nm, greater than or equal to about 850 nm, greater than or equal to about 900 nm, greater than or equal to about 950 nm, greater than or equal to about 1 micrometer (μm), or greater than or equal to about 1.5 μm.

The thickness of the organic layer may be less than or equal to about 100 μm, less than or equal to about 90 μm, less than or equal to about 80 μm, less than or equal to about 70 μm, less than or equal to about 60 μm, less than or equal to about 50 μm, less than or equal to about 40 μm, less than or equal to about 30 μm, less than or equal to about 20 μm, less than or equal to about 10 μm, less than or equal to about 9 μm, less than or equal to about 8 μm, less than or equal to about 7 μm, less than or equal to about 6 μm, less than or equal to about 5 μm, less than or equal to about 4 μm, less than or equal to about 3 μm, less than or equal to about 2 μm, or less than or equal to about 1 μm.

The electroluminescent device of an embodiment may include or may not include an additional cover glass on the organic layer. The electroluminescent device of an embodiment may not include an additional cover glass, which may provide additional advantages in the process.

In an embodiment, the electroluminescent device may further include a hole auxiliary layer 2, 20 between the first electrode 1, 10 and the light emitting layer 3, 30. The hole auxiliary layer 2, 20 may include a hole injection layer, a hole transport layer, an electron blocking layer, or a combination thereof. The hole auxiliary layer 2, 20 may be a single layer or a multilayer structure in which adjacent layers include different components. (Reference to FIGS. 1A, 1B, 2A, and 2B)

The hole auxiliary layer 2, 20 may have a HOMO energy level that can be matched with the HOMO energy level of the light emitting layer 3, 30 in order to enhance mobility of holes transferred from the hole auxiliary layer 2, 20 to the light emitting layer 3, 30. In an embodiment, the hole auxiliary layer 2, 20 may include a hole injection layer close to, e.g., adjacent, the first electrode 1, 10 and a hole transport layer close to, e.g., adjacent, the light emitting layer 3, 30.

In an embodiment, the material included in the hole auxiliary layer 20 (e.g., a hole transport layer, a hole injection layer, or an electron blocking layer) is not particularly limited, and may include, for example, poly(9,9-dioctyl-fluorene-co-N-(4)-butylphenyl)-diphenylamine) (TFB), polyarylamine, poly(N-vinylcarbazole), poly(3,4-ethylenedioxythiophene) (PEDOT), poly(3,4-ethylenedioxythiophene):polystyrene sulfonate (PEDOT:PSS), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA (4,4',4"-Tris[phenyl(m-tolyl)amino]triphenylamine), 4,4',4"-tris(N-carbazolyl)-triphenylamine (TCTA), 1,1-bis[(di-4-toylamino)phenyl]cyclohexane (TAPC), a p-type metal oxide (e.g., NiO, $WO_3$, $MoO_3$, etc.), a carbon-based material such as graphene oxide, or a combination thereof, but is not limited thereto.

In the hole auxiliary layer, the thickness of each layer may be appropriately selected. For example, the thickness of each layer may be greater than or equal to about 5 nm, greater than or equal to about 10 nm, greater than or equal to about 15 nm, or greater than or equal to about 20 nm and less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

A device according to an embodiment as shown in FIG. 2A may have a normal structure. In the device of an embodiment, the anode 10 disposed on the transparent substrate 100 may include a metal oxide-based transparent electrode (e.g., an ITO electrode), and the cathode 50 facing the anode 10 may include a conductive metal (e.g., having a relatively low work function, Mg, Al, etc.). The hole auxiliary layer 20 (e.g., a hole injection layer such as PEDOT:PSS, p-type metal oxide, or a combination thereof; a hole transport layer such as TFB, polyvinylcarbazole (PVK), or a combination thereof; or a combination thereof) may be provided between the transparent electrode 10 and the light emitting layer 30. The hole injection layer may be disposed close to, e.g., adjacent, the transparent electrode and the hole transport layer may be disposed close to, e.g., adjacent, the light emitting layer. The electron transport layer or the electron auxiliary layer including the same (such as an electron injection/transport layer) 40 may be disposed between the light emitting layer 30 and the cathode 50. The organic layer 60 may be disposed on at least a portion of or the entire surface of the electron transport layer or the electron auxiliary layer including the same 40 and at least a portion of or the entire surface of the second electrode 50.

A substrate 100 may be disposed on or over the organic layer and the second electrode as shown in FIG. 2B.

In an embodiment, the electroluminescent device of an embodiment may be manufactured by a method, which includes:

forming a light emitting (e.g., a patterned) layer including a semiconductor nanoparticle on or over a first electrode, forming an electron transport layer on the light emitting layer, and forming a second electrode on or over the electron transport layer, and the method further comprises forming an organic layer on or over the electron transport layer, and optionally, (at least a portion of) the second electrode, and maintaining a resulting stacked structure including the organic layer at a temperature of greater than or equal to about 40° C., greater than or equal to about 50° C., greater than or equal to about 55° C., greater than or equal to about 60° C., or greater than or equal to about 65° C., for a predetermined time period (for example, of greater than or equal to about 12 hours, 20 hours, or about 24 hours and less than or equal to about 30 days, from about 36 hours to about 20 days, or from about 48 hours to about 10 days), to provide the device.

In an embodiment, the method may further include forming a hole auxiliary layer on the first electrode (for example, disposed on a substrate), for example via a physical deposition (e.g., a vapor deposition) or a coating process. The method may further include forming an electron injection layer and/or a hole blocking layer on or over the electron transport layer. The forming of the light emitting layer (or a patterned layer) of the semiconductor nanoparticles is the same as described herein.

A manner to form the second electrode is not particularly limited and an appropriate one such as a physical deposition or a coating may be selected taking into account a type of an electrode material.

The formation of the organic layer may include applying an organic layer forming composition (e.g., an organic layer forming liquid or an organic layer forming solution) including the polymeric acid compound on the electron transport layer (or the electron auxiliary layer including the ETL) or on the second electrode. Details of the polymeric acid compound are the same described herein. The preparation of the organic layer forming composition may include dissolving the polymeric acid compound in water or an organic solvent.

The organic layer forming composition may further include an additive, whereby the organic layer may further include the additive. Details of the additive are the same as set forth herein. A concentration of the additive in the organic layer forming composition may be selected taking into account a type of the additive, a type of the polymeric acid compound, a thickness of the organic layer to be formed, or the like.

The organic solvent may include a C1-10 alcohol such as ethanol, methanol, propanol, isopropanol, (iso)butanol, (iso)pentanol, hexanol, heptanol, octanol, nonanol, etc.; a nitrile solvent such as acetonitrile; an ester solvent such as an ethyl acetate; or a combination thereof.

In an embodiment, the polymeric acid compound has a relatively high level of solubility in water or an organic solvent, and therefore, the organic layer forming composition may have an appropriate viscosity for forming the organic layer. The viscosity of the organic layer forming liquid may be in a range of from about 2 centipoise (cPs) to about 20 cPs, from about 3 cPs to about 15 cPs, or from about 7 cPs to about 12 cPs, at room temperature (for example, at 20-30° C. or 25° C.), or a combination thereof, but is not limited thereto.

A concentration of the polymeric acid compound in the organic layer forming composition may be appropriately selected taking into consideration the types of the polymeric acid compound and an additive, a desired organic layer thickness, or the like.

In an embodiment, a concentration or an amount of the polymeric acid compound in the organic layer forming composition may be, based on a total weight of the composition, greater than or equal to about 0.01 wt %, greater than or equal to about 0.05 wt %, greater than or equal to about 0.1 wt %, greater than or equal to about 0.5 wt %, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, greater than or equal to about 20 wt %, greater than or equal to about 21 wt %, greater than or equal to about 22 wt %, greater than or equal to about 23 wt %, greater than or equal to about 24 wt %, greater than or equal to about 25 wt %, greater than or equal to about 26 wt %, greater than or equal to about 27 wt %, greater than or equal to about 28 wt %, greater than or equal to about 29 wt %, greater than or equal to about 30 wt %, greater than or equal to about 31 wt %, greater than or equal to about 32 wt %, greater than or equal to about 33 wt %, greater than or equal to about 34 wt %, greater than or equal to about 35 wt %, greater than or equal to about 36 wt %, greater than or equal to about 37 wt %, greater than or equal to about 38 wt %, greater than or equal to about 39 wt %, or greater than or equal to about 40 wt %.

In an embodiment, a concentration or an amount of the polymeric acid compound in the organic layer forming composition may be, based on a total weight of the composition, less than or equal to about 99 wt %, less than or equal to about 90 wt %, less than or equal to about 85 wt %, less than or equal to about 80 wt %, less than or equal to about 75 wt %, less than or equal to about 70 wt %, less than or equal to about 65 wt %, less than or equal to about 60 wt %, less than or equal to about 55 wt %, less than or equal to about 50 wt %, less than or equal to about 45 wt %, less than or equal to about 40 wt %, less than or equal to about 35 wt %, less than or equal to about 30 wt %, less than or equal to about 25 wt %, less than or equal to about 20 wt %, less than or equal to about 15 wt %, less than or equal to about 10 wt %, or less than or equal to about 5 wt %.

In an embodiment, the organic layer forming composition may further include an additive, and a concentration of the additive in the composition may be from about 0.0001 moles/liter (M) to 10M, from about 0.0005M to about 5M, from about 0.001M to about 4M, from about 0.005M to about 3M, from about 0.01M to about 2M, from about 0.05M to about 1.5M, from about 0.1M to about 1.3M, from about 0.1M to about 1.2M, from about 0.15M to about 1M, from about 0.15M to about 0.9M, from about 0.2M to about 0.8M, from about 0.3M to about 0.7M, from about 0.4M to about 0.6M, from about 0.45M to about 0.55M, or a combination thereof.

The method of applying the organic layer forming composition is not particularly limited and may be appropriately selected. The application may involve a spin coating, a dropwise coating, or a combination thereof. After the application of the organic layer forming composition, an excess amount of the composition may be removed by spinning or the like.

The formation of the organic layer may not involve a polymerization and/or crosslinking reaction. Accordingly, an amount of a crosslinked polymer in the organic layer may be less than 1% by weight, based on a total weight of the organic layer. Without wishing to be bound by a particular theory, it is believed that the provision of a layer containing a crosslinked polymer (for example, as a major component) on or over the electron transport layer may result in the significant light absorption at a certain range of wavelengths, which may make it difficult for the prepared light-emitting device to be used, for example, for a front light-emitting type display panel having a second electrode as a transparent electrode.

In addition, the inventors have found that the organic layer forming composition including a crosslinked resin easily causes a significantly increased viscosity, and thus forming an organic layer with a desired or controlled thickness may become more difficult. Moreover, the inventors have found that the presence of the organic layer including a crosslinked resin may cause a relatively sharp decrease of the luminance as a device is operated over time, and also found that an organic layer formed by adding an acid component (e.g., an acetic acid) to such a crosslinked resin may further aggravate the deterioration of the light-emitting properties and lifespan of the device.

In an embodiment, the stacked structure including the organic layer may be maintained or kept under an appropriate atmosphere (for example, under an inert gas atmosphere or an oxygen free or oxygen containing atmosphere) at a predetermined temperature. In an embodiment, the stacked structure including the organic layer may be encapsulated by, for example, glass, and the maintaining step may be conducted in the atmosphere (e.g., an oxygen containing atmosphere).

Surprisingly, the inventors have found that after the keeping or maintaining the stacked structure including the organic layer formed on or over the electron transport layer at the predetermined temperature for a predetermined time period makes it possible to prepare a light emitting device with significantly improved electroluminescent properties and/or a relatively long lifespan in comparison with a device prepared without undergoing the heat maintaining process described herein. Without wishing to be bound by a particular theory, it is believed that during the heat maintaining process, the polymeric acid compound included in the organic layer may have positive (or passivating) effects on a surface of the metal oxide nanoparticle in the electron auxiliary layer resulting in a decrease in surface defects for the metal oxide nanoparticles.

Without wishing to be bound by a particular theory, it is believed that the polymeric acid compound and if present the additive may improve the quality of the electron auxiliary (e.g., electron transport) layer as explained herein and thus may enhance the device including the same as a whole.

The metal oxide nanoparticles in the electron auxiliary layer, for example, may be manufactured by a solution process, and may include multiple defects (e.g., metal ions such as $Zn^{2+}$, $Mg^{2+}$, oxygen vacancy, unreacted chemicals such as O2—, —OH, $CH_3COO$—, zinc-OH, and Zn—O residues) for example on a surface thereof. As described above, it is believed that these defective sites may have energy levels close to the HOMO level of semiconductor nanoparticles present in the light emitting layer, whereby a hole leakage is more likely to occur.

In the organic layer of an embodiment, the polymeric acid compound (e.g., having the average molecular weight described above) is a hydrophilic polymer, so a limited amount of moisture together with a relatively labile acid moiety (e.g., COOH groups) may exist in the organic layer. In an embodiment, a stacked structure with an organic layer as formed is maintained in a predetermined atmosphere (e.g., an inert gas atmosphere or an oxygen/nitrogen atmosphere), the moisture and/or the acid moieties in the organic layer containing the polymeric acid compound may relatively readily and gradually come in contact with the metal oxide nanoparticles in the electron auxiliary layer, resulting in an improvement (e.g., a reduction) in surface defects. For example, the moisture and/or the acid component may relatively readily and gradually migrate to the electronic auxiliary layer during the heat maintaining process, resulting in an interaction or a reaction (e.g., dehydration condensation reaction, etc.) with the surface of the metal oxide nanoparticle (e.g., with hydroxyl group or various defective sites possibly present in the metal oxide nanoparticles). It is believed that the interaction and the reaction may modify a surface of the metal oxide nanoparticle, capable of removing (or passivating) some or all of the defective sites and/or leading to a growth of the nanoparticle.

The temperature for the heat maintaining process may be appropriately selected taking into consideration the polymeric acid compound and/or the additive included in the organic layer. In an embodiment, the temperature for the heat maintaining process may greater than or equal to about 40° C., greater than or equal to about 45° C., or greater than or equal to about 55° C., greater than or equal to about 60° C., greater than or equal to about 65° C., greater than or equal to about 70° C., or greater than or equal to about 75° C. The temperature for the heat maintaining process may be about 180° C. or less, about 160° C. or less, about 140° C. or less, about 120° C. or less, about 100° C. or less, about 90° C. or less, about 80° C. or less, or about 70° C. or less.

The time for the heat maintaining process may be appropriately selected taking into consideration the polymeric acid compound and/or the additive included in the organic layer. The time for the heat maintaining process may be greater than or equal to about 1 hour, greater than or equal to about 3 hours, greater than or equal to about 5 hours, greater than or equal to about 7 hours, greater than or equal to about 12 hours, greater than or equal to about 20 hours, greater than or equal to about 24 hours, greater than or equal to about 36 hours, greater than or equal to about 48 hours, or greater than or equal to about 50 hours and less than or equal to about 30 days, less than or equal to about 20 days, less than or equal to about 10 days, less than or equal to about 5 days, less than or equal to about 3 days, less than or equal to about 2 days, less than or equal to about 1 days, less than or equal to about 18 hours, less than or equal to about 14 hours, or less than or equal to about 8 hours.

The atmosphere for the heat maintaining process is not particularly limited. In an embodiment, an encapsulation element may be placed on the obtained stack structure prior to conducting the heat maintaining process (see FIG. 3). The encapsulation element may be airtight encapsulation layer of the stack structure. The encapsulation element may include an inorganic material such as glass, an organic material such as a polymer, or a combination thereof. In an embodiment, the encapsulation element may include a curable resin. The curable resin may include a UV curable resin. The curable resin may include a (meth)acrylate-based resin or polymer, a vinyl ether-based resin or polymer, an epoxy-based resin or polymer, an oxetane-based resin or polymer, or a combination thereof. In one embodiment, the encapsulation element may include a metal oxide, e.g., $SiO_2$, glass, or the like. In one embodiment, the encapsulation element may be disposed on the organic layer (e.g., directly above the organic layer). The encapsulation element may contact at least a portion of the organic layer but is not limited thereto.

The electroluminescent device of an embodiment may exhibit both improved electroluminescent properties, for example, and a longer lifespan as described herein.

The light emitting device of an embodiment may be configured to emit red light, green light, or blue light.

In an embodiment, the electroluminescent device may have a maximum external quantum efficiency (EQE) of greater than or equal to about 5%, greater than or equal to about 5.5%, greater than or equal to about 6%, greater than or equal to about 6.5%, greater than or equal to about 7%, greater than or equal to about 7.5%, greater than or equal to about 7.7%, greater than or equal to about 8%, greater than or equal to about 8.5%, greater than or equal to about 9%, greater than or equal to about 9.5%, greater than or equal to about 10%, greater than or equal to about 10.5%, greater than or equal to about 11%, greater than or equal to about 11.5%, greater than or equal to about 12%, greater than or equal to about 12.5%, greater than or equal to about 13%, greater than or equal to about 13.5%, or greater than or equal to about 14%. The maximum external quantum efficiency (EQE) may be less than or equal to about 60%, less than or equal to about 50%, less than or equal to about 40%, less than or equal to about 30%, or less than or equal to about 20%.

The electroluminescent device of an embodiment may exhibit a maximum luminance of greater than or equal to about 10,000 candela per square meter ($cd/m^2$), greater than or equal to about 30,000 $cd/m^2$, greater than or equal to about 40,000 $cd/m^2$, greater than or equal to about 60,000 $cd/m^2$, greater than or equal to about 65,000 $cd/m^2$, greater than or equal to about 70,000 $cd/m^2$, greater than or equal to about 80,000 $cd/m^2$, greater than or equal to about 90,000 $cd/m^2$, greater than or equal to about 100,000 $cd/m^2$, greater than or equal to about 110,000 $cd/m^2$, greater than or equal to about 120,000 $cd/m^2$, greater than or equal to about 130,000 $cd/m^2$, greater than or equal to about 140,000 $cd/m^2$, greater than or equal to about 150,000 $cd/m^2$, greater than or equal to about 160,000 $cd/m^2$, greater than or equal to about 170,000 $cd/m^2$, greater than or equal to about 180,000 $cd/m^2$, greater than or equal to about 190,000 $cd/m^2$, greater than or equal to about 200,000 $cd/m^2$, greater than or equal to about 210,000 $cd/m^2$, greater than or equal to about 220,000 $cd/m^2$, greater than or equal to about 230,000 $cd/m^2$, greater than or equal to about 240,000 $cd/m^2$, greater than or equal to about 250,000 $cd/m^2$, greater than or equal to about 300,000 $cd/m^2$, greater than or equal to about 400,000 $cd/m^2$, greater than or equal to about 500,000 $cd/m^2$, greater than or equal to about 600,000 $cd/m^2$, greater than or equal to about 700,000 $cd/m^2$, greater than or equal to about 800,000 $cd/m^2$, greater than or equal to about 900,000 $cd/m^2$, or greater than or equal to about 1,000,000 $cd/m^2$. The maximum luminance may be less than or equal to about 10,000,000 $cd/m^2$, less than or equal to about 5,000,000 $cd/m^2$, less than or equal to about 1,000,000 $cd/m^2$, or less than or equal to about 900,000 $cd/m^2$.

The electroluminescent device of an embodiment may exhibit a maximum luminous efficiency of greater than or equal to about 6 candela per ampere (cd/A), greater than or equal to about 7 cd/A, greater than or equal to about 8 cd/A, greater than or equal to about 9 cd/A, greater than or equal to about 10 cd/A, greater than or equal to about 15 cd/A, greater than or equal to about 20 cd/A, or greater than or equal to about 30 cd/A. The electroluminescent device of an embodiment may exhibit a maximum luminous efficiency of less than or equal to about 1000 cd/A, less than or equal to about 500 cd/A, or less than or equal to about 100 cd/A.

In an embodiment, as measured by driving the device at a predetermined initial luminance (for example, about 650 nit), the electroluminescent device may exhibit a T50 of greater than or equal to about 25 hours, greater than or equal to about 30 hours, greater than or equal to about 40 hours, greater than or equal to about 50 hours, greater than or equal to about 60 hours, greater than or equal to about 65 hours, greater than or equal to about 70 hours, greater than or equal to about 80 hours, greater than or equal to about 90 hours, greater than or equal to about 100 hours, greater than or equal to about 120 hours, greater than or equal to about 150 hours, greater than or equal to about 180 hours, greater than or equal to about 200 hours, or greater than or equal to about 250 hours. The T50 may be from about 25 hours to about 1000 hours, 130 hours to about 500 hours, from about 190 hours to about 300 hours, or a combination thereof.

In an embodiment, as measured by driving the device at a predetermined initial luminance (for example, about 650 nit), the electroluminescent device may have a T90 of greater than or equal to about 5 hours, e.g., a T90 of greater than or equal to about 6 hours, greater than or equal to about 7 hours, greater than or equal to about 7.5 hours, greater than or equal to about 8 hours, greater than or equal to about 9 hours, greater than or equal to about 10 hours, greater than or equal to about 20 hours, greater than or equal to about 30 hours, greater than or equal to about 40 hours, greater than or equal to about 50 hours, greater than or equal to about 60 hours, greater than or equal to about 70 hours, greater than or equal to about 80 hours, greater than or equal to about 90 hours, greater than or equal to about 100 hours, greater than or equal to about 110 hours, greater than or equal to about 120 hours, or greater than or equal to about 130 hours. The T90 may be from about 35 hours to about 1500 hours, from about 55 hours to about 1200 hours, from about 85 hours to about 1000 hours, from about 105 hours to about 900 hours, from about 115 hours to about 800 hours, from about 145 hours to about 500 hours, or a combination thereof.

In an embodiment, a display device includes the electroluminescent device described herein.

The display device may include a first pixel and a second pixel that is configured to emit light different from the light of the first pixel.

Figure 4A:
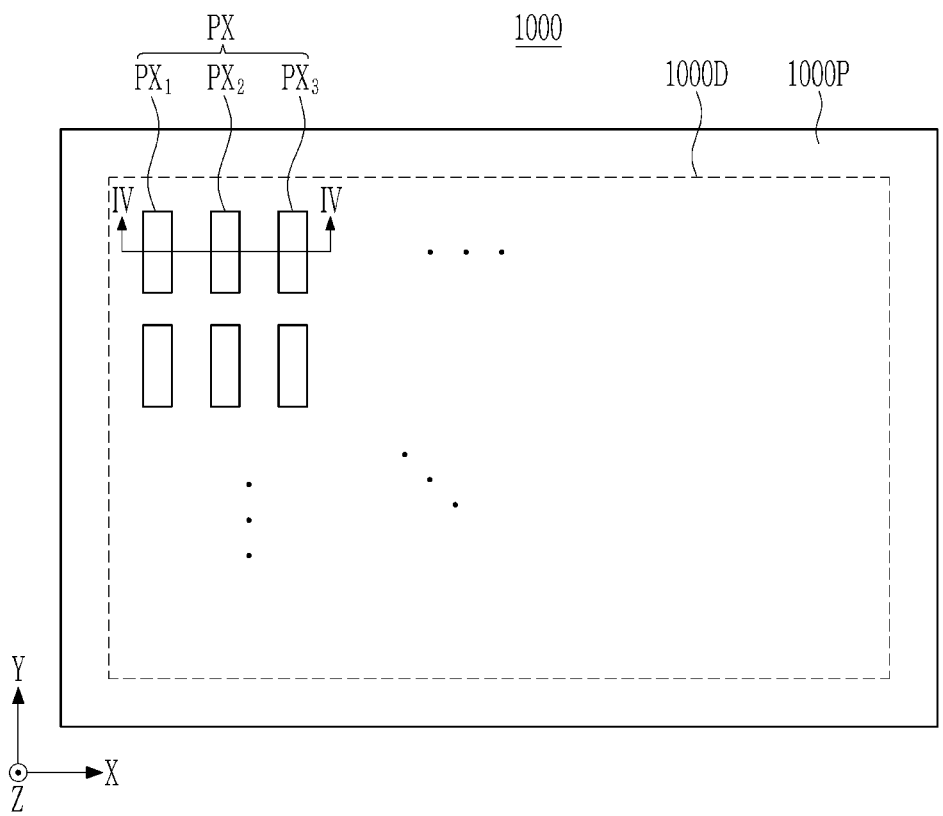
FIG. 4A is a schematic plan view illustrating a display panel of an embodiment.

Referring to FIG. 4A, a display panel 1000 according to an embodiment includes a display area 1000D for displaying an image and a non-display area 1000P disposed around the display area 1000D, in which the binding element may be located.

The display area 1000D may include a plurality of pixels PXs arranged along a row (e.g., x direction) and/or a column (e.g., y direction), and each pixel PX may include a plurality of sub-pixels $PX_1$, $PX_2$, and $PX_3$ displaying different colors. As an example, a configuration in which three sub-pixels $PX_1$, $PX_2$, and $PX_3$ constitute one pixel PX is illustrated, but the configuration is not limited thereto. An additional sub-pixel such as a white sub-pixel may be further included, and one or more sub-pixel displaying the same color may be included. The plurality of pixels PXs may be arranged in, for example, a Bayer matrix, a PenTile matrix, and/or a diamond matrix, but is not limited thereto.

Each of the sub-pixels $PX_1$, $PX_2$, and $PX_3$ may be configured to display a color of three primary colors or a combination of three primary colors, for example, red, green, blue, or a combination thereof (e.g., white light). For example, the first sub-pixel $PX_1$ may be configured to display red, the second sub-pixel $PX_2$ may be configured to display green, and the third sub-pixel $PX_3$ may be configured to display blue.

In FIG. 4A, each of the sub-pixels are depicted to have the same size, but the present disclosure is not limited thereto. For example, at least one of the sub-pixels may be larger or smaller, or have a different shape, than another sub-pixel.

In an embodiment, the display panel of an embodiment may include a light emitting panel 100 which may include a lower substrate 110, a buffer layer 111, a thin film transistor TFT, and a light emitting element 180. The display panel may further include a circuit element for switching and/or driving each of the light emitting elements.

Figure 4B:
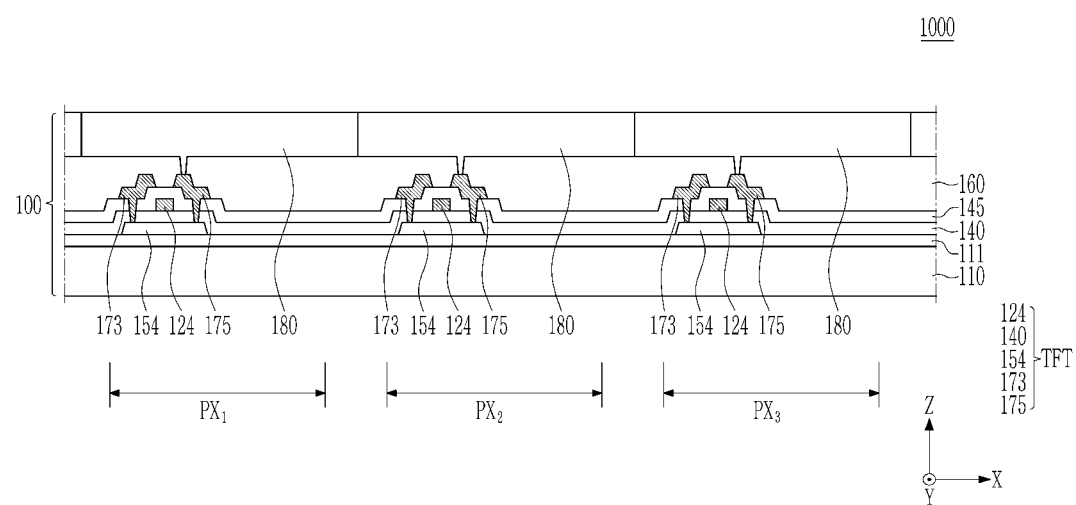
FIG. 4B is a cross-sectional view taken along line IV-IV (as shown in FIG. 4A)

Referring to FIG. 4B, in the light emitting panel of an embodiment, the light emitting element 180 may be disposed for each sub-pixel $PX_1$, $PX_2$, and $PX_3$. The light emitting element 180 disposed in each sub-pixel $PX_1$, $PX_2$, and $PX_3$ may be independently driven. The subpixel may include a blue subpixel, red subpixel, or a green subpixel. At least one of the light emitting element 180 may be an electroluminescent element according to an embodiment described herein.

Details of the substrate are the same as described herein. The buffer layer 111 may include an organic material, an inorganic material, or an organic-inorganic material. The buffer layer 111 may include, for example, an oxide, a nitride, or an oxynitride, and may include, for example, silicon oxide, silicon nitride, silicon oxynitride, or a combination thereof, but is not limited thereto. The buffer layer 111 may be one layer or two or more layers and may cover a portion of or the entire surface of the lower substrate 110. The buffer layer 111 may be omitted.

The thin film transistor TFT may be a three terminal element for switching and/or driving the light emitting element 180, and one or two or more may be included for each sub-pixel. The thin film transistor TFT may include a gate electrode 124, a semiconductor layer 154 overlapped with the gate electrode 124, a gate insulating layer 140 between the gate electrode 124 and the semiconductor layer 154, and a source electrode 173 and a drain electrode 175 electrically connected to the semiconductor layer 154. A coplanar top gate structure is shown as an example, but the structure is not limited thereto and may have various structures.

The gate electrode 124 is electrically connected to a gate line (not shown), and may include, for example, a low-resistance metal such as aluminum (Al), molybdenum (Mo), copper (Cu), titanium (Ti), silver (Ag), gold (Au), an alloy thereof, or a combination thereof, but is not limited thereto.

The semiconductor layer 154 may be an inorganic semiconductor such as amorphous silicon, polycrystalline silicon, or oxide semiconductor; an organic semiconductor; an organic-inorganic semiconductor; or a combination thereof. For example, the semiconductor layer 154 may include an oxide semiconductor including at least one of indium (In), zinc (Zn), tin (Sn), and gallium (Ga), and the oxide semiconductor may include, for example, indium-gallium-zinc oxide, zinc-tin oxide, or a combination thereof, but they are not limited thereto. The semiconductor layer 154 may include a channel region and doped regions disposed on both sides of the channel region and electrically connected to the source electrode 173 and the drain electrode 175, respectively.

The gate insulating layer 140 may include an organic material, an inorganic material, or an organic-inorganic material, and may include, for example, an oxide, a nitride, or an oxynitride, and may include, for example, silicon oxide, silicon nitride, silicon oxynitride, or a combination thereof, but is not limited thereto. In the drawing, an example in which the gate insulating layer 140 is formed on the entire surface of the lower substrate 110 is illustrated, but the present disclosure is not limited thereto and may be selectively formed between the gate electrode 124 and the semiconductor 154. The gate insulating layer 140 may be formed of one or two or more layers.

The source electrode 173 and the drain electrode 175 may include, for example, a low-resistance metal such as aluminum (Al), molybdenum (Mo), copper (Cu), titanium (Ti), silver (Ag), gold (Au), an alloy thereof, or a combination thereof, but are not limited thereto. The source electrode 173 and the drain electrode 175 may be electrically connected to the doped regions of the semiconductor layer 154, respectively. The source electrode 173 is electrically connected to a data line (not shown), and the drain electrode 175 is electrically connected to a light emitting element 180.

An interlayer insulating layer 145 is additionally formed between the gate electrode 124 and the source/drain electrodes 173 and 175. The interlayer insulating layer 145 may include an organic material, an inorganic material, or an organic-inorganic material, for example, oxide, nitride, or oxynitride, for example, silicon oxide, silicon nitride, silicon oxynitride, or a combination thereof, but is not limited thereto. The interlayer insulating layer 145 may be formed of one or two or more layers.

A protective layer 160 is formed on the thin film transistor TFT. The protective layer 160 may be, for example, a passivation layer. The protective layer 160 may include an organic material, an inorganic material, or an organic-inorganic material, for example, polyacrylic, polyimide, polyamide, poly(amide-imide), or a combination thereof, but is not limited thereto. The protective layer 160 may be formed of one or two or three or more layers.

In an embodiment, one of the first electrode 1, 10 and the second electrode 5, 50, may be a pixel electrode linked to the TFT and the other of them may be a common electrode.

In an embodiment, the electroluminescent device or the display device including the same may be used in a top emission type, a bottom emission type, a dual emission type, or a combination thereof.

In an embodiment, the first electrode 1, 10 may be a light transmitting electrode and the second electrode 5, 50 may be a reflective electrode, and the display panel may be a bottom emission type display panel that emits light toward the first electrode 10 and the substrate 100, if present. In an embodiment, the first electrode 1, 10 may be a reflective electrode and the second electrode 5, 50 may be a light transmitting electrode, and the display panel may be a top emission type display panel that emits light to the opposite side of the first electrode 10 and the substrate 100 if present. In one embodiment, both the first electrode and the second electrode may be translucent electrodes, and the display panel 1000 may be a both side emission type display panel that emits light on the substrate side and on the opposite side of the substrate.

The display device or an electronic apparatus may include (or may be) a television, a virtual reality/augmented reality (VR/AR), a handheld terminal, a monitor, a notebook computer, an electronic display board, a camera, or a part for an automatic, e.g., autonomous, vehicle.

Specific examples are described below. However, the examples described below are only for specifically illustrating or explaining the disclosure, and the scope of the disclosure is not limited thereto.

EXAMPLES

1. Electroluminescence Measurement
A current according to an applied voltage is measured with a Keithley 2635B source meter, and a CS2000 spectrometer is used to measure electroluminescent properties (e.g., luminance) of a light-emitting device.
2. Life-Span Characteristics
T90 and T50 are measured with an initial luminance of 650 nit.
3. UV-Vis Spectroscopy
An UV-Vis spectroscopy analysis is performed using an Agilent Cary5000 spectrophotometer to obtain an UV-Visible absorption spectrum.

The following synthesis is performed under an inert gas atmosphere (e.g., under nitrogen) unless otherwise specified. A precursor content is provided as a molar content, unless otherwise specified.

Synthesis Example 1

2 moles per liter (M) of a Se/trioctylphosphine (TOP) stock solution, 1M of a S/TOP stock solution, and 0.1M of a Te/TOP stock solution are prepared by dispersing selenium (Se), sulfur (S), and tellurium (Te) in trioctylphosphine (TOP), respectively. In a reactor containing trioctylamine, 0.125 millimoles (mmol) of zinc acetate is added to the reactor with oleic acid and heated at 120° C. under vacuum. After 1 hour, nitrogen is introduced into the reactor.

The reactor is heated to 300° C., and the Se/TOP stock solution and the Te/TOP stock solution in a Te:Se mole ratio of 1:20 are rapidly added to, e.g., injected into, the reactor. After 40 minutes, the reaction is complete, and the reaction solution is rapidly cooled to room temperature and acetone is added to the reactor. The resulting product mixture is centrifuged and the precipitate is separated and dispersed in toluene to prepare a ZnSeTe core particle dispersion.

Amounts of 1.8 mmol of zinc acetate and oleic acid are added to a flask containing trioctylamine and the prepared mixture is heated at 120° C. under vacuum for 10 minutes. Nitrogen ($N_2$) is then introduced into the reactor, the reactor is heated to 180° C., and the prepared ZnTeSe core particle dispersion is added quickly to the reactor. The Se/TOP stock solution and the S/TOP stock solution are also added to the reactor, and the reactor temperature is raised to about 280° C. After 2 hours, the reaction is complete, and the reactor is cooled to room temperature and ethanol is added to facilitate precipitation of the semiconductor nanoparticles, which are separated by centrifuge. The prepared semiconductor nanoparticles emit blue light, and a photoluminescent spectroscopy analysis using Hitachi F-7000 spectrophotometer confirms that the blue light has a maximum emission peak wavelength of about 455 nanometers (nm).

The synthesized semiconductor nanoparticles (optical density 0.25 at 420 nm, 6 milliliters (mL)) are precipitated with ethanol and centrifuged and the separated nanoparticles dispersed in octane to prepare an octane dispersion.

Synthesis Example 2: Synthesis of ZnMgO Nanoparticles

Zinc acetate dihydrate and magnesium acetate tetrahydrate are added into a reactor including dimethylsulfoxide at a pre-determined mole ratio according to the following chemical formula and heated at 60° C. in an air atmosphere. Subsequently, a solution of tetramethylammonium hydroxide pentahydrate and ethanol is added into the reactor in a dropwise fashion at a speed of 3 milliliters per minute (mL/min). After stirring the mixture, the prepared $Zn_{1-x}Mg_xO$ nanoparticles are centrifuged, separated, and dispersed in ethanol to provide an ethanol dispersion of $Zn_{1-x}Mg_xO$ (x=0.15) nanoparticles.

The prepared nanoparticles are analyzed by a transmission electron microscopic analysis, and the results show that the particles have an average particle size of about 3 nm.

Example 1

The dispersion of zinc magnesium oxide nanoparticles prepared in Synthesis Example 2 is used as an electron transport layer dispersion (hereinafter, ETL dispersion).

A polyacrylic acid (weight average molecular weight: 450,000 product name: poly(acrylic acid), PAA, Sigma-Aldrich (181285)) is dissolved in ethanol, and added with citric acid ($HOC(COOH)(CH_2COOH)_2$, CAS number 77-92-9) at a concentration of 0.1M to produce an organic layer forming composition (a concentration of the polymeric acid compound: 5% by weight).

A glass substrate deposited with indium tin oxide (ITO) is surface treated with ultraviolet (UV)-ozone for 15 minutes, and then spin-coated with a poly(3,4-ethylenedioxythiophene) polystyrene sulfonate (PEDOT:PSS) solution (H. C. Starks) and heated at 150° C. for 10 minutes under air atmosphere and heated again at 150° C. for 20 to 30 minutes under $N_2$ atmosphere to provide a hole injection layer (HIL) having a thickness of 30 nm.

Subsequently, poly[(9,9-dioctylfluorenyl-2,7-diyl-co(4,4'-(N-4-butylphenyl) diphenylamine] solution (TFB) (Sumitomo) is spin-coated on the hole injection layer and heated at 150° C. for 30 minutes to provide a hole transport layer (HTL) having a thickness of 25 nm.

The octane dispersion of the semiconductor nanoparticles prepared from Synthesis Example 1 is spin-coated on the prepared hole transport layer to prepare a light emitting layer having a thickness of 25 nm, which is then heat-treated at a temperature of about 80° C. under a nitrogen atmosphere for 30 minutes.

The ETL dispersion is spin-coated onto the heat-treated light emitting layer and is heat-treated at 80° C. to form an electron transport layer with a thickness of about 20 nm.

Figure 3:
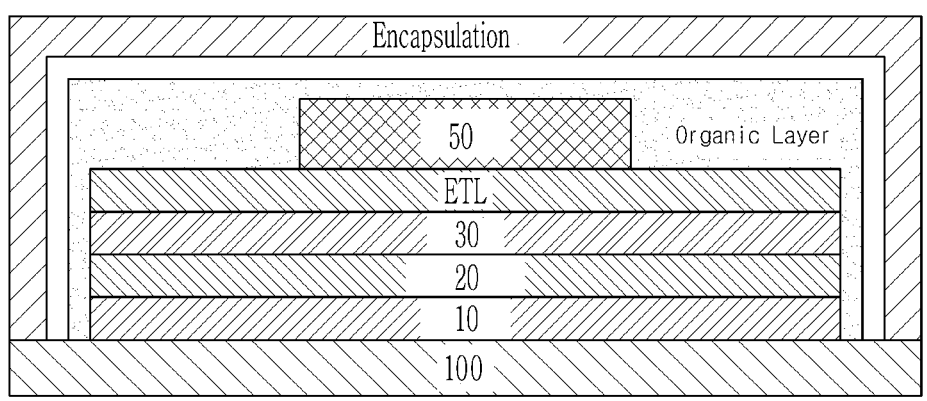
FIG. 3 is a schematic cross-sectional view of an electroluminescent device according to an embodiment.

Aluminum (Al) is vacuum-deposited on the prepared electron transport layer to prepare a second electrode of a thickness of about 100 nm, providing a stacked structure (hereinafter, QD stack). The organic layer forming composition is placed and spin-coated on the QD stack, which is then dried to form an organic layer having a thickness of about 3 micrometers (μm). An encapsulation element including a UV-curable resin (Nagase Co. Ltd.) is placed over the organic layer and the resulting stacked structure (for example, as shown in FIG. 3) is placed in a constant temperature oven at 70° C. for five days to obtain an electroluminescent device.

Electroluminescent properties of the prepared electroluminescent device are measured and the results are shown in Table 1.

Figure 5A:
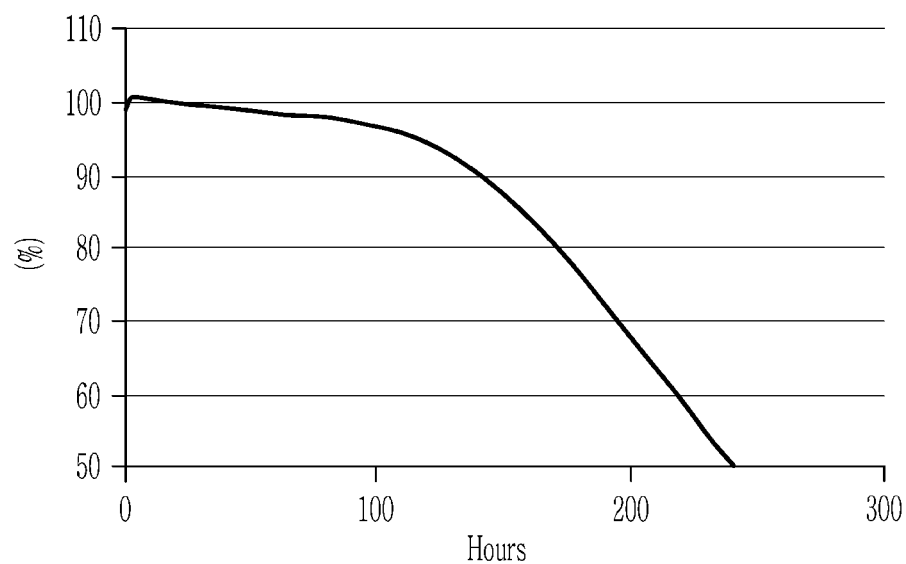
FIG. 5A is a plot illustrating lifespan characteristics of the electroluminescent device of Example 1 overtime.

For the prepared electroluminescent device, a lifespan property is measured as being driven at an initial luminance of 650 nit and the results are shown in FIG. 5A. From the results, it is confirmed that the T50 of the device is about 241.1 hours.

Example 2-1

An electroluminescent device is prepared in the same manner as Example 1 except for an increase in thickness of the organic layer to about 5 µm. Electroluminescent properties of the prepared electroluminescent device are measured and the results are shown in Table 1. It is confirmed that the prepared electroluminescent device has a T50 of 252.4 hours as measured at an initial luminance of 650 nit.

Example 2-2

An electroluminescent device is prepared in the same manner as Example 1 except for changing the concentration of the citric acid to 0.2 M for the preparation of the organic layer forming composition. Electroluminescent properties of the prepared electroluminescent device are measured, and the results are shown in Table 1. It is confirmed that the prepared electroluminescent device has a T50 of 236 hours as measured at an initial luminance of 650 nit.

Example 2-3

An electroluminescent device is prepared in the same manner as Example 1 except for not using citric acid. Electroluminescent properties of the prepared electroluminescent device are measured, and the results are shown in Table 1.

Example 3-1

An electroluminescent device is prepared in the same manner as Example 1 except that in the preparing of the organic layer forming composition, a polyacrylic acid with a number average molecular weight of 1800 (1.8 k) (CAS number: 9003-01-4, Sigma-Aldrich) is dissolved in ethanol (a concentration of the polymeric acid compound: 20% by weight). Electroluminescent properties of the prepared electroluminescent device are measured, and the results are shown in Table 1.

Example 3-2

An electroluminescent device is prepared in the same manner as Example 1 except for preparing the organic layer forming liquid by dissolving a polyacrylic acid with a number average molecular weight of 1800 (1.8 k) (CAS number: 9003-01-4, Sigma-Aldrich) in ethanol (a concentration of the polymeric acid compound: 20% by weight) and adding citric acid (HOC(COOH)(CH$_2$COOH)$_2$, CAS number 77-92-9) at a concentration of 0.1M. Electroluminescent properties of the prepared electroluminescent device are measured, and the results are shown in Table 1.

Example 4

An electroluminescent device is prepared in the same manner as Example 1 except for preparing the organic layer forming composition by dissolving a polyacrylic acid with a weight average molecular weight of 450000 (450 k) (CAS number: 9003-01-4, manufacturer: Sigma-Aldrich) in ethanol (a concentration of the polymeric acid compound: 5% by weight) and adding sulfuric acid at a concentration of 10 mM instead of the citric acid. Electroluminescent properties of the prepared electroluminescent device are measured, and the results are shown in Table 1.

It is confirmed that the prepared electroluminescent device has a T50 of 300 hours as measured at an initial luminance of 650 nit.

Comparative Example 1

An electroluminescent device is prepared in the same manner as Example 1 without the formation of the organic layer. Electroluminescent properties of the prepared electroluminescent device are measured, and the results are shown in Table 1.

Comparative Example 2

An electroluminescent device is prepared in the same manner as Example 1 except for, instead of the organic layer forming liquid including the polymeric acid compound and the citric acid, using an organic layer forming composition prepared by dissolving a polymethylmethacrylate (PMMA) with a number average molecular weight of 460000 (460 k) (CAS number: 9011-14-7, Sigma-Aldrich) in acetone (a concentration of the PMMA: 5% by weight).

For the prepared device, electroluminescent properties are measured, and the results are shown in Table 1.

Comparative Example 3

An electroluminescent device is prepared in the same manner as Example 1 except for, instead of the organic layer forming liquid including the polymeric acid compound and the citric acid, using an organic layer forming composition prepared from a cross-linkable resin (Loctite® 366, from Henkel Co., Ltd).

For the prepared device, electroluminescent properties are measured, and the results are shown in Table 1.

Comparative Example 4

An electroluminescent device is prepared in the same manner as Example 1 except for, instead of using the organic layer forming liquid including the polymeric acid compound and the citric acid, using the organic layer forming composition prepared from a cross-linkable resin (Loctite 366, from Henkel Co., Ltd) and acetic acid (concentration of the acid: 2 wt % based on a total weight of the composition).

For the prepared device, electroluminescent properties are measured, and the results are shown in Table 1. The Examples list the components for the organic layer forming composition.

TABLE 1

| Example No. | Max EQE (%) | Max Luminance (nit) | T90 (hour) |
|---|---|---|---|
| Example 1(PAA450k + CtA of 0.1M) | 10.3 | 88115 | 141.2 |
| Example 2-1(PAA450k + CtA of 0.1M) thickness, 5 µm | 10.3 | 82514 | 150.5 |
| Example 2-2(PAA450k + CtA of 0.2M) | 10.2 | 77500 | 183.6 |

TABLE 1-continued

| Example No. | Max EQE (%) | Max Luminance (nit) | T90 (hour) |
|---|---|---|---|
| Example 2-3 (PAA 450k) | 11 | 81300 | 128 |
| Example 3-1 (PAA 1.8k) | 11.8 | 89013 | 38.3 |
| Example 3-2 (PAA 1.8k + CtA of 0.1M) | 10.8 | 90593 | 74.1 |
| Example 4 (PAA 450k + $H_2SO_4$) | 10.5 | 80321 | 200 |
| Comp. Example 1 (no resin) | 2 | 18905 | 0.2 |
| Comp. Example 2 (PMMA) | 3.1 | 19630 | 0.6 |
| Comp. Example 3 (Loctite 366) | 9.8 | 76286 | 20 |
| Comp. Example 4(Loctite366 + AC) | 9.4 | 69000 | 10 |

PAA: polyacrylic acid
CtA: citric acid
AC: acetic acid
450k: a molecular weight of 450,000 g/mol
1.8k: a molecular weight of 1800 g/mol
nit: $cd/m^2$ All Example devices are prepared with an organic layer thickness of 3 micrometers, except Example 2-1 with a thickness of 5 micrometers. From the results of Table 1, it is confirmed that the electroluminescent devices of Examples exhibit improved electroluminescent properties and extended life as compared to the devices of Comparative Examples.

Experimental Example 1: Measurement of Delta Voltage

The device prepared in Example 1, the device prepared in Comparative Example 3, and the device prepared in Comparative Example 4 are driven at 650 nit to observe changes in voltage. Device performance is shown in FIG. 5B.

Figure 5B:
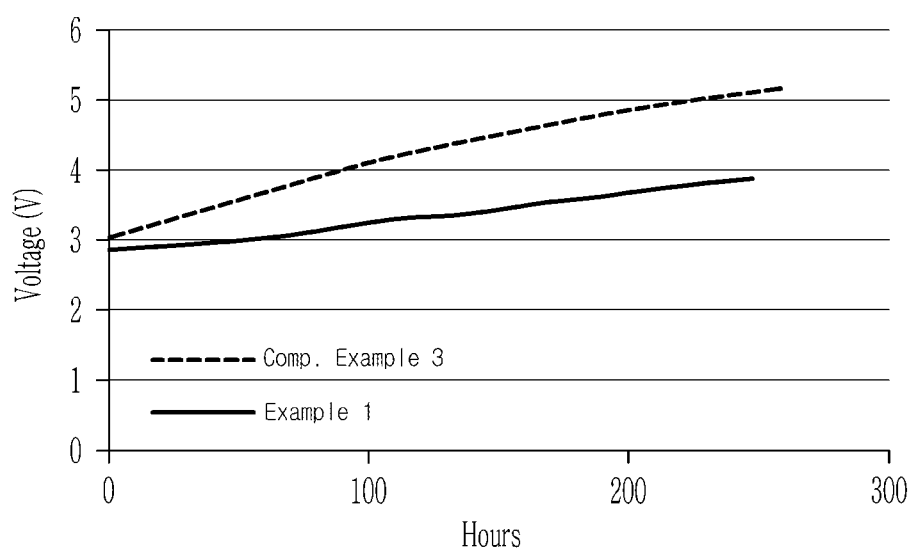
FIG. 5B is a plot illustrating the delta voltage of Example 1 and Comparative Example 3.

From the results of FIG. 5B, it is confirmed that the device of Example 1 has a significantly lower voltage increase (that is, a significantly lower resistance increase) than the device manufactured in Comparative Example 3. In the device of Example 1, it is confirmed that the delta voltage is far less than 1 volt at 100 hours, for example, the delta voltage value is approximately 0.5 volt at 150 hours.

In the device of Comparative Example 3, it is confirmed that the delta voltage value exceeds 1 volt at 100 hours and exceeds 1.5 volts at 150 hours.

Without wishing to be bound by any theory, the above results indicate that degradation of the internal material such as the light emitting layer of the device of Example 1 is significantly suppressed in comparison with the devices of the comparative examples. It is also confirmed that the delta voltage value of the device manufactured in Comparative Example 4 is greater than the delta voltage value of Comparative Example 3.

Experimental Example 2: UV-Vis Absorption Spectroscopy of Organic Layer Forming Composition A UV-Vis spectroscopy analysis is performed on the organic layer forming composition of Example 1 and the organic layer forming composition of Comparative Example 3, and the results are shown in FIG. 6. The results of FIG. 6 show that the organic layer forming composition of Example 1 does not substantially absorb light in the range of 320 nm to 450 nm, whereas the organic layer forming composition of Comparative Example 3 prepared with the cross-linkable resin Loctite® 366 does have substantial light absorption in the stated wavelength range.

Experimental Example 3: Electron Only Device (EOD) Analysis

An electron only device is prepared as below.

A dispersion of zinc magnesium oxide nanoparticles prepared in Synthesis Example 2 is spin-coated on a glass substrate deposited with indium tin oxide (ITO), and heated at 80° C. for 30 minutes to provide an electron transport layer (ETL) having a thickness of 30 nm.

Subsequently, the octane dispersion of the semiconductor nanoparticles is spin-coated on the prepared electron transport layer to prepare a light emitting layer having a thickness of 25 nm. An ETL dispersion of the same zinc magnesium oxide nanoparticles is spin-coated onto the light emitting layer and heat-treated at 80° C. to form an electron transport layer with a thickness of about 30 nm. Then, aluminum (Al) is vacuum-deposited on the prepared electron transport layer as an electrode, providing a QD stacked structure for EOD (hereinafter, Ref. EOD).

The organic layer forming composition prepared in Example 3-1, the organic layer forming composition prepared in Example 3-2, or the organic layer forming composition (Loctite®336) prepared in Comparative Example 3 is applied on a Reference EOD to form an organic layer having a thickness of about 3.5 μm, providing EOD 1, EOD 2, and EOD3, respectively. An encapsulation element is placed over the organic layer and the resulting stacked structure is placed in a constant temperature oven at 70° C. for five days.

A voltage sweep analysis including a forward scan and a backward scan (repeated a total of three times) by applying a voltage from 0 volt to 8 volts between the ITO and the Al electrode, for each of Reference EOD, EOD 1, EOD 2, and EOD 3, was conducted, and the maximum current of the third sweep is measured, and the results are shown in Table 2.

TABLE 2

| | A current density at 8 volts ($mA/cm^2$), in the $3^{rd}$ sweep |
|---|---|
| Ref. EOD | 21 |
| EOD 1 (PAA1.8K) | 288.3 |
| EOD 2 (PAA 1.8k + CtA) | 372.6 |
| EOD 3 (Loctite ®336) | 73.6 |

The above results confirmed that an electron-only device with the organic layer of Examples 3 and 4 exhibit improved electron transport capability compared to an EOD prepared with the organic layer of Comparative Example 3.

Example 5

An electroluminescent device is prepared in the same manner as Example 1 except for using an aqueous solution of poly(4-styrene sulfonic acid) (PSS, Cas no. 28210-41-5, weight average molecular weight: 75000 (75 k), Sigma-Aldrich) (a concentration of the polymeric acid compound: 18% by weight) to form an organic layer, instead of the organic layer forming liquid including the PAA. Electroluminescent properties of the prepared electroluminescent device are measured and the results are shown in Table 3 as a relative value with respect to the properties of the device of Comparative Example 1.

TABLE 1

| Example No | Relative Percentage of Maximum EQE [1] | Relative Percentage of Maximum Luminance [2] | Relative T90 [3] |
|---|---|---|---|
| Comp. Example 1 | 100% | 100% | 1 |
| Example 5 | 480% | 450% | 500 |

Note [1]:
[Max. EQE of a given device/Max. EQE of the device of Comparative Example 1] × 100
Note [2]:
[Max Luminance of a given device/Max Luminance of the device of Comparative Example 1] × 100
Note [3]:
T90 (hour) of a given device/T90 (hour) of the device of Comparative Example 1

From the results of Table 1, it is confirmed that the electroluminescent devices of Example 5 exhibit improved electroluminescent properties and extended life relative to the devices of the Comparative Examples.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. An electroluminescent device comprising
a first electrode;
a second electrode;
a light emitting layer disposed between the first electrode and the second electrode;
an electron transport layer disposed between the light emitting layer and the second electrode; and
an organic layer disposed on the electron transport layer,
wherein the light emitting layer comprises a plurality of semiconductor nanoparticles,
wherein the electron transport layer comprises a plurality of metal oxide nanoparticles,
wherein the organic layer comprises a polymeric acid compound,
wherein the polymeric acid compound comprises a carboxylic acid group, a phosphonic acid group (—PO(OH)$_2$), a sulfonic acid group (—SO$_3$H), or a combination thereof, and
wherein the polymeric acid compound has a weight average molecular weight of greater than or equal to about 800 g/mol and less than or equal to about 8,000,000 g/mol.

2. The electroluminescent device of claim 1, wherein the polymeric acid compound has a weight average molecular weight of greater than or equal to about 1200 g/mol and less than or equal to about 1,200,000 g/mol.

3. The electroluminescent device of claim 1, wherein the polymeric acid compound exhibits a solubility of greater than or equal to about 1 gram per liter and less than or equal to about 1000 gram per liter, with respect to water.

4. The electroluminescent device of claim 1, wherein the polymeric acid compound has a pH of less than or equal to about 5.

5. The electroluminescent device of claim 1, wherein the polymeric acid compound comprises a polyacrylic acid, a polymethacrylic acid, a polyacrylic acid-methacrylic acid, an alkali metal salt of a polyacrylic acid, a copolymer including a (meth)acrylic acid repeating unit, a polyvinyl phosphonic acid, a poly(aromatic sulfonic acid) compound, a poly(vinyl sulfonic acid), a polymaleic acid, an alginic acid compound, or a combination thereof.

6. The electroluminescent device of claim 1, wherein the organic layer further comprises an additive, and the additive comprises an inorganic acid, a C2-50 carboxylic acid compound represented by R(COOH)$_n$, a sulfinic acid compound represented by R(SO$_2$H)$_n$, a sulfonic acid compound represented by R(SO$_3$H)$_n$, or a combination thereof, and wherein R is a substituted or unsubstituted C1 to C50 aliphatic or aromatic hydrocarbon group, and n is an integer of 1 to 10.

7. The electroluminescent device of claim 1, wherein the organic layer further comprises a carboxylic acid compound and the carboxylic acid compound comprises benzoic acid, succinic acid, maleic acid, fumaric acid, malic acid, glutaric acid, adipic acid, pimelic acid, citric acid, oxalic acid, malonic acid, phthalic acid, isophthalic acid, terephthalic acid, trimellitic acid, hemimellitic acid, azelaic acid, suberic acid, tartaric acid, itaconic acid, dodecanedioic acid, sulfuric acid, acetic acid, (meth)acrylic acid, or a combination thereof.

8. The electroluminescent device of claim 1, wherein in the organic layer an amount of a crosslinked polymer is less than or equal to about 1 weight percent based on a total weight of the organic layer.

9. The electroluminescent device of claim 1, wherein the organic layer does not comprise a crosslinked polymer.

10. The electroluminescent device of claim 1, wherein a thickness of the organic layer is greater than or equal to about 10 nanometers and less than or equal to about 100 micrometers.

11. The electroluminescent device of claim 1, wherein the second electrode has a first surface facing a surface of the electron transport layer and a second surface opposite the first surface, and the organic layer is disposed on at least a portion of the surface of the electron transport layer and at least a portion of the second surface of the second electrode.

12. The electroluminescent device of claim 1, wherein the metal oxide nanoparticle comprise zinc, and at least one of a Group IIA metal, Zr, W, Li, Ti, Y, Al, Ga, In, Sn, Co, or V.

13. The electroluminescent device of claim 1, wherein the metal oxide nanoparticle comprises zinc, a Group IIA metal, and optionally an alkali metal.

14. The electroluminescent device of claim 1, wherein the light emitting layer is configured to emit blue light, and
wherein the electroluminescent device shows a maximum luminance of greater than or equal to about 60,000 candela per square meter, and
wherein the electroluminescent device exhibits a maximum external quantum efficiency of greater than or equal to about 6%.

15. The electroluminescent device of claim 1, wherein the light emitting layer is configured to emit blue light, and
wherein the electroluminescent device shows a maximum luminous efficiency of greater than or equal to about 6 candela per ampere, and
wherein the electroluminescent device exhibits a T90 of greater than or equal to about 20 hours as measured at an initial luminance of 650 nit.

16. The electroluminescent device of claim 1, wherein the electroluminescent device exhibits a voltage increase of less than 1.5 volts driven at a luminance of 650 nit for 150 hours.

17. A display device comprising the electroluminescent device of claim 1.

18. The display device of claim 17, wherein the display device comprises an augmented reality device, a virtual reality device, a handheld terminal, a monitor, a notebook computer, a television, an electronic display board, a camera, or an electronic component for an automatic vehicle.

19. A method of producing the electroluminescent device of claim 1, the method comprising:
    forming the light emitting layer on the first electrode,
    forming the electron transport layer on the light emitting layer,
    forming the second electrode on the electron transport layer, and
    forming the organic layer on the electron transport layer, and
    maintaining a stacked structure having the formed organic layer at a temperature of greater than or equal to about 40° C. and less than or equal to about 120° C. to form the device,
    wherein the formation of the organic layer comprises applying an organic layer forming liquid comprising the polymeric acid compound, and water and/or an organic solvent, on the electron transport layer or the second electrode layer.

20. The method of claim 19, wherein the organic solvent comprises a C1-10 alcohol solvent, a nitrile solvent, an ester solvent, or a combination thereof; and
    wherein the formation of the organic layer does not involve a polymerization reaction.

* * * * *